(12) United States Patent
Aoki et al.

(10) Patent No.: US 6,242,287 B1
(45) Date of Patent: Jun. 5, 2001

(54) SEMICONDUCTOR DEVICE MANUFACTURING METHOD, PRESS DIE AND GUIDE RAIL INCLUDING FORMING A CRACK PERPENDICULAR TO AN EXTENSION OF THE SEALING RESIN

(75) Inventors: Hideji Aoki; Hidenori Sekiya; Kenichirou Katou; Hiromu Nishitani, all of Tokyo (JP)

(73) Assignees: Mitsubishi Denki Kabushiki Kaisha; Mitsubishi Electric Engineering Co., Ltd., both of Tokyo (JP)

( * ) Notice: Subject to any disclaimer, the term of this patent is extended or adjusted under 35 U.S.C. 154(b) by 0 days.

(21) Appl. No.: 09/044,928

(22) Filed: Mar. 20, 1998

(30) Foreign Application Priority Data

Oct. 3, 1997 (JP) .................................................. 09-270887

(51) Int. Cl.[7] .......................... H01L 21/44; H01L 21/48; H01L 21/50
(52) U.S. Cl. ............................ 438/111; 438/112; 438/118
(58) Field of Search .................................... 438/112, 111, 438/118, 123, 264

(56) References Cited

U.S. PATENT DOCUMENTS 5,304,841 * 4/1994 Negoro .
5,316,463 * 5/1994 Neu .
5,886,398 * 3/1999 Low et al. .
5,914,531 * 6/1999 Tsunoda et al. .
5,929,511 * 7/1999 Nakazawa et al. .

FOREIGN PATENT DOCUMENTS

08227960 * 9/1996 (JP) .

* cited by examiner

Primary Examiner—John F. Niebling
Assistant Examiner—Ron Pompey
(74) Attorney, Agent, or Firm—Oblon, Spivak, McClelland, Maier & Neustadt, P.C.

(57) ABSTRACT

Provided are a method for manufacturing a semiconductor device in which a sealing resin is prevented from being damaged and generation of a resin piece is suppressed, a press die for suppressing the generation of the resin piece, and a guide rail. A frame receiving die (11) includes a cavity (11d) having a rectangular contour shape seen on a plane which serves to house a sealing resin (3) therein, and a remaining gate housing section (11c) provided on any of four corners of the cavity (11d) corresponding to a remaining gate (3b) on a lower face of a corner (2a) of a lead frame (2). A lower gate punch (11a) is provided in a boundary portion between the cavity (11d) and the remaining gate housing section (11c). When the lead frame (2) is mounted on the frame receiving die (11), the sealing resin (3) is housed in the cavity (11d) and the remaining gate (3b) is housed in the remaining gate housing section (11c).

10 Claims, 25 Drawing Sheets

SEMICONDUCTOR DEVICE MANUFACTURING METHOD, PRESS DIE AND GUIDE RAIL INCLUDING FORMING A CRACK PERPENDICULAR TO AN EXTENSION OF THE SEALING RESIN

BACKGROUND OF THE INVENTION

1. Field of the Invention

The present invention relates to a method and apparatus for manufacturing a semiconductor device, and more particularly to a manufacturing method capable of reducing generation of a resin piece, a press die and a guide rail.

2. Description of the Background Art

In general, a semiconductor device has a structure in which an integrated circuit portion (a semiconductor chip) is sealed with an insulating material such as a resin, and includes a lead extending through the insulating material for electrical connection of an integrated circuit to an external portion. In the following description, a quad flat package (QFP) will be taken as an example.

First of all, a process of manufacturing the QFP will be described below. In general, a flat package semiconductor device such as the QFP is formed by mounting a semiconductor chip on a terminal member referred to as a lead frame and sealing the semiconductor chip with a resin.

The semiconductor chip is first fixed (die bonded) to a portion referred to as a die pad of a lead frame 20 and is connected (wire bonded) to a lead by wiring. Then, the semiconductor chip is sealed with a sealing resin 3. The lead frame 20 is band-shaped and has a structure in which a plurality of semiconductor chips are arranged.

FIG. 30 is a plan view showing the lead frame 20 in a state in which the semiconductor chip is completely sealed with the resin. In FIG. 30, a plurality of sealing resins 3 are arranged in a line. At a resin sealing step, the semiconductor chip is enclosed by a die to form a cavity, and a liquid resin is poured into the cavity. Then, the resin is cured to form the sealing resin 3. A path (gate) for introducing the resin remains on a surface of the lead frame 20 with the resin filled therein. When the lead frame 20 is separated from the die, most of the gate is removed (gate break). A residual portion of the gate makes a remaining gate 3a.

As shown in FIG. 31, the lead frame 20 is divided by press molding for each section corresponding to one semiconductor device (single substance cut). At this step, a divided lead frame 2 is obtained. In this stage, the lead frame 2 has a tie bar TB in a lead LD.

Then, the tie bar TB is removed by the press molding as shown in FIG. 32 (tie bar cut).

Thereafter, four corners of the lead frame 2 are removed by press molding as shown in FIG. 33 (pinch cut). At a pinch cut step, the four corners of the lead frame 2 are connected to a die pad (not shown) on which the semiconductor chip is mounted and a pinch portion (not shown) of a suspension lead supporting a die is cut away. At this time, the remaining gate 3a is also removed. At this step, the lead frame 2 remains on only a tip of a lead group LG extending from the sealing resin 3 in four directions.

Subsequently, an unnecessary portion of the lead frame 2 remaining on the tip of the lead group LG is removed and the lead LD is subjected to bending. Thus, the QFP is finished.

Since the semiconductor device according to the prior art has been manufactured by the above-mentioned method, it has had the following problems.

FIG. 34 is a detailed diagram showing a structure in FIG. 32. As shown in FIG. 34, a pinch portion 2b of the suspension lead extends from four corners of the sealing resin 3, and is connected to four corners 2a of the lead frame 2. At the pinch cut step, the four corners 2a of the lead frame 2 are removed. In this case, the remaining gate 3a becomes a problem. The remaining gate 3a extends from the corner of the sealing resin 3 to a surface of the corner 2a of the lead frame 2.

FIG. 35 is a perspective view showing an X region in FIG. 34. At the pinch cut step, the lead frame 2 is cut away along the virtual cutting line CL shown by a broken line in FIG. 35 so that the corner 2a is removed. In this case, the pinch portion 2b is torn for removal.

The remaining gate 3a is a residual portion of the gate formed by an upper gate method. In the case where the gate is formed by a lower gate method, a remaining gate is formed in a position which is vertically reverse to that of the remaining gate 3a. The same remaining gate is indicated at 3b. FIG. 36 corresponds to FIG. 35 in which the remaining gate 3b is formed.

A step of removing the remaining gate 3b shown in FIG. 36 will be described below with reference to FIGS. 37 and 38. As shown in FIG. 37, the lead frame 2 is mounted on a die 9. FIG. 37 is a sectional view showing the corner 2a. A punch 8 descends from above the corner 2a. The punch 8 presses down the corner 2a so that a cutting line CL portion which is not shown is cut away and the pinch portion 2b is torn at the same time. At this time, the remaining gate 3b is broken off together with the corner 2a. In that case, a stress converges on a bottom portion of the remaining gate 3b so that the sealing resin 3 is broken off and a resin fracture portion 3d is formed or a crack is generated. When the remaining gate 3b is broken off, a resin piece is sometimes generated.

In the process of manufacturing a semiconductor device which has been described with reference to FIGS. 30 to 33, the lead frame 2 is often slid and carried on a guide rail. However, the remaining gate 3b exists on a lower face of the corner 2a of the lead frame 2, that is, on a face on a side which comes in contact with the guide rail as described above with reference to FIG. 36. As shown in FIG. 34, a remaining air vent 3e exists in each of the three corners of the sealing resin 3 except the corner where the remaining gate 3a (or the remaining gate 3b) is formed.

An air vent serves to prevent air accumulation from being generated in the cavity when the liquid resin is poured from the gate into the cavity, and is provided on each of three corners of the cavity. Accordingly, the resin is filled in so that it overflows from the air vent. The overflowing resin is cured so that the remaining air vent 3e is formed. The remaining air vent 3e is formed on upper and lower faces of the lead frame 2.

Consequently, the remaining gate 3b and the remaining air vent 3e rub against the guide rail when the lead frame 2 is slid on the guide rail. At this time, there is a possibility that a resin piece might be generated from the remaining gate 3b and the remaining air vent 3e and might cut into the sealing resin 3 or stick to the surface of the lead LD.

In the process of manufacturing a semiconductor device which has been described with reference to FIGS. 30 to 33, the press molding is performed. During the press molding, the remaining gates 3a and 3b and the remaining air vent 3e might be crushed to generate the resin piece. For example, if a processing proceeds to another press step in a state in which the resin piece adheres to the sealing resin 3 or the lead LD, the resin piece might cut into the sealing resin 3 or stick to the lead LD at the same press step.

Thus, the method for manufacturing a semiconductor device according to the prior art has had a problem that the sealing resin is damaged and the resin piece cuts into the sealing resin and sticks to the lead, thereby causing product failures.

SUMMARY OF THE INVENTION

A first aspect of the present invention is directed to a method for manufacturing a semiconductor device, comprising the steps of (a) forming, on a lead frame, a sealing resin for sealing an integrated circuit by using a resin sealing die, (b) forming a crack in a predetermined position of a remaining gate extending from the sealing resin to the lead frame in a direction perpendicular to a direction of the extension corresponding to a gate of the resin sealing die, and (c) breaking off the remaining gate in a portion where the crack is formed when an unnecessary portion of the lead frame is removed by press molding.

A second aspect of the present invention is directed to the method for manufacturing a semiconductor device, wherein the step (b) includes a step of (b-1) pushing, into the predetermined position of the remaining gate, a gate punch having an edge provided in a tip portion perpendicularly to the direction of extension of the remaining gate, and causing the edge to cut into the remaining gate.

A third aspect of the present invention is directed to the method for manufacturing a semiconductor device, wherein the remaining gate is a lower remaining gate formed on a lower face side of the lead frame, the gate punch is fixed to a frame receiving die for mounting the lead frame, the frame receiving die includes a remaining gate housing section provided so as to house the lower remaining gate when the lead frame is mounted, and the gate punch forms a part of a wall of the remaining gate housing section and is provided in such a manner that the edge is positioned lower than a face of the frame receiving die on which the lead frame is mounted, the step (b-1) including a step of (b-2) mounting the lead frame on the frame receiving die and press molding down the lead frame from above to cause the edge to cut into the lower remaining gate, and sealing the lower remaining gate in a region defined by the gate punch, the remaining gate housing section and the lead frame.

A fourth aspect of the present invention is directed to the method for manufacturing a semiconductor device, wherein the frame receiving die is divided into a body section forming the remaining gate housing section and a cavity for housing the sealing resin, and the gate punch, the body section including an elastic member for forcing the body section in one direction, and a slide guide which houses the elastic member, is inserted in the body section and is formed slidably with the body section, so that the body section is movable in a vertical direction, and the step (b-2) including a step of mounting the lead frame on the body section which is movable in the vertical direction.

A fifth aspect of the present invention is directed to the method for manufacturing a semiconductor device, wherein the remaining gate housing section has an inlet port connected to a collecting device, and the step (b) includes a step of sucking, through the inlet port, a resin piece generated when the edge cuts into the lower remaining gate.

A sixth aspect of the present invention is directed to the method for manufacturing a semiconductor device, wherein the remaining gate is an upper remaining gate formed on an upper face side of the lead frame, the gate punch is fixed to a frame presser for press molding an upper face of the lead frame, the frame presser includes a remaining gate housing section provided so as to house the upper remaining gate when the lead frame is pressed, and the gate punch forms a part of a wall of the remaining gate housing section and is provided in such a manner that the edge is positioned higher than a face of the frame presser press molding the lead frame, the step (b-1) including a step of (b-2) mounting the lead frame on a frame receiving die and press molding the lead frame by the frame presser to cause the edge to cut into the upper remaining gate, and sealing the upper remaining gate in a region defined by the gate punch, the remaining gate housing section and the lead frame.

A seventh aspect of the present invention is directed to the method for manufacturing a semiconductor device, wherein the frame presser is divided into a body section forming the remaining gate housing section and a cavity for housing the sealing resin, and the gate punch, the body section including an elastic member for forcing the body section in one direction, and a slide guide which houses the elastic member, is inserted in the body section and is formed slidably with the body section, so that the body section is movable in a vertical direction, and the step (b-2) including a step of press molding the lead frame by the body section which is movable in the vertical direction.

An eighth aspect of the present invention is directed to the method for manufacturing a semiconductor device, wherein the frame receiving die includes a collecting port connected to a collecting device in a position corresponding to the remaining gate housing section, the step (b) including a step of sucking, through the collecting port, a resin piece generated when the edge cuts into the upper remaining gate.

A ninth aspect of the present invention is directed to the method for manufacturing a semiconductor device, wherein the step (c) includes a step of (c-1) pushing an edge provided in a tip portion of a lead frame removing punch against a portion of the upper remaining gate into which the gate punch cuts and press molding down the lead frame removing punch, the lead frame removing punch including a remaining gate removing punch having the edge provided perpendicularly to a direction of extension of the upper remaining gate, and a remaining gate clearance section provided so as to house the upper remaining gate when the lead frame is pressed.

A tenth aspect of the present invention is directed to the method for manufacturing a semiconductor device, wherein the remaining gate removing punch is provided in such a manner that the edge is positioned higher than a face of the lead frame removing punch press molding the lead frame.

An eleventh aspect of the present invention is directed to a press die for press molding a semiconductor device having a sealing resin for sealing an integrated circuit formed on a lead frame by using a resin sealing die, comprising a gate clearance section for housing a remaining gate extending from the sealing resin to the lead frame corresponding to a gate of the resin sealing die, and for preventing the remaining gate from being broken during press molding, and an air vent clearance section for housing a remaining air vent extending from the sealing resin to the lead frame corresponding to an air vent of the resin sealing die, and for preventing the remaining air vent from being broken during the press molding.

A twelfth aspect of the present invention is directed to a guide rail for carrying a semiconductor device having a sealing resin for sealing an integrated circuit formed on a lead frame by using a resin sealing die, comprising a gate clearance groove provided in a longitudinal direction of the guide rail for preventing a remaining gate, extending from the sealing resin to the lead frame corresponding to a gate of the resin sealing die, from coming in contact with the guide rail during carrying, and an air vent clearance groove provided in the longitudinal direction of the guide rail for preventing a remaining air vent, extending from the sealing resin to the lead frame corresponding to an air vent of the resin sealing die, from coming in contact with the guide rail during the carrying.

According to the first aspect of the present invention, the crack is formed in the predetermined position of the remaining gate in the direction perpendicular to the direction of extension. When the unnecessary portion of the lead frame is removed by the press molding, the remaining gate is broken off in the portion where the crack is formed. Therefore, a stress can be prevented from being applied to a bottom portion of the remaining gate, the sealing resin can be inhibited from being damaged, and generation of a resin piece can be prevented.

According to the second aspect of the present invention, the crack can easily be formed in the predetermined position of the remaining gate.

According to the third aspect of the present invention, the edge of the gate punch is positioned lower, by a predetermined length, than the face of the frame receiving die on which the lead frame is mounted. Therefore, the crack can be formed without the edge completely dividing the lower remaining gate. Furthermore, when the edge of the gate punch is caused to cut into the lower remaining gate, the lower remaining gate is sealed in the region defined by the gate punch, the remaining gate housing section and the lead frame. Consequently, a resin piece generated when the edge cuts into the lower remaining gate can be prevented from scattering over an outside.

According to the fourth aspect of the present invention, when the lead frame is mounted on the frame receiving die having the body section which is movable in the vertical direction, it tightly comes in contact with the body section. By press molding down the lead frame with that state kept, the lower remaining gate is pushed against the edge of the gate punch. Therefore, the resin piece generated when the edge cuts into the lower remaining gate can completely be prevented from scattering.

According to the fifth aspect of the present invention, the lower remaining gate is sealed in the region defined by the gate punch, the remaining gate housing section and the lead frame, and the resin piece generated when the edge cuts into the lower remaining gate is sucked. Consequently, the resin piece can completely be prevented from scattering.

According to the sixth aspect of the present invention, the edge of the gate punch is positioned lower, by a predetermined length, than the face of the frame presser press molding the lead frame. Therefore, the crack can be formed without the edge completely dividing the upper remaining gate. Furthermore, when the edge of the gate punch is caused to cut into the upper remaining gate, the upper remaining gate is sealed in the region defined by the gate punch, the remaining gate housing section and the lead frame. Consequently, the resin piece generated when the edge cuts into the upper remaining gate can be prevented from scattering over an outside.

According to the seventh aspect of the present invention, when the frame presser having the body section which is movable in the vertical direction is pushed against the lead frame, the lead frame tightly comes in contact with the body section. By press molding down the lead frame with that state kept, the resin piece generated when the edge cuts into the upper remaining gate can completely be prevented from scattering.

According to the eighth aspect of the present invention, the upper remaining gate is sealed in the region defined by the gate punch, the remaining gate housing section and the lead frame, and the resin piece generated when the edge cuts into the upper remaining gate is sucked. Consequently, the resin piece can completely be prevented from scattering.

According to the ninth aspect of the present invention, when the unnecessary portion of the lead frame having the upper remaining gate is removed, it is possible to prevent the lead frame removing punch from crushing the upper remaining gate to generate the resin piece, and to remove the upper remaining gate together with the unnecessary portion without applying a stress to the bottom portion of the remaining gate.

According to the tenth aspect of the present invention, the remaining gate removing punch can break off the upper remaining gate by the crack without the edge completely dividing the upper remaining gate.

According to the eleventh aspect of the present invention, the remaining gate and the remaining air vent can be prevented from being broken during the press molding. Therefore, the generation of the resin piece can be reduced. There is less possibility that the resin piece might cut into the sealing resin or stick to the lead at another press step when a processing proceeds to the same press step with the resin piece adhering to the sealing resin or the lead. Thus, the generation rate of product failures can be reduced.

According to the twelfth aspect of the present invention, also in the case where the lead frame is slid and carried on the guide rail, the remaining gate and the remaining air vent can be prevented from coming in contact with the surface of the guide rail. Therefore, the resin piece can be prevented from being generated from the remaining gate and the remaining air vent. Thus, there is less possibility that the resin piece might cut into the sealing resin during carrying or stick to the surface of the lead. Consequently, the generation rate of the product failures can be reduced.

In order to solve the above-mentioned problems, it is an object of the present invention to provide a method for manufacturing a semiconductor device which can prevent a sealing resin from being damaged and suppress generation of a resin piece, and to provide a press die for suppressing the generation of the resin piece, and a guide rail.

These and other objects, features, aspects and advantages of the present invention will become more apparent from the following detailed description of the present invention when taken in conjunction with the accompanying drawings.

DESCRIPTION OF THE PREFERRED EMBODIMENTS

<Introduction>

Figure 34:
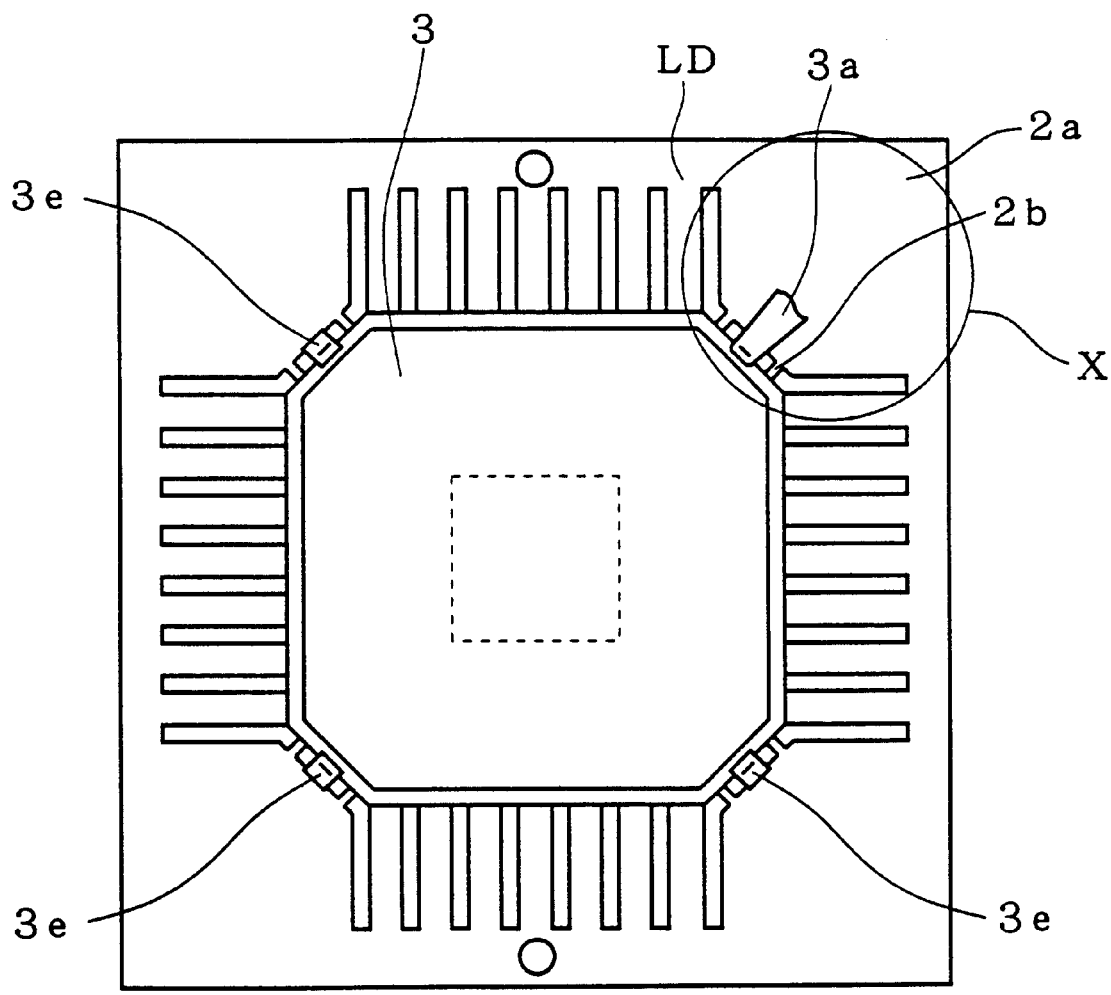
FIG. 34 is a plan view showing a structure of a quad flat package.

The inventors have employed a method for removing a remaining gate which will be described below in order to prevent a sealing resin from being damaged. A method for removing a remaining gate (hereinafter referred to as a lower remaining gate) obtained when forming a gate by a lower gate method will be described below with reference to FIGS. 1 to 6. A method for removing a remaining gate (hereinafter referred to as an upper remaining gate) obtained when forming the gate by an upper gate method will be described below with reference to FIGS. 7 to 9. In the following description, a quad flat package (QFP) which has been described with reference to FIG. 34 will be taken as an example.

<Method for Removing Lower Remaining Gate>

Figure 1:
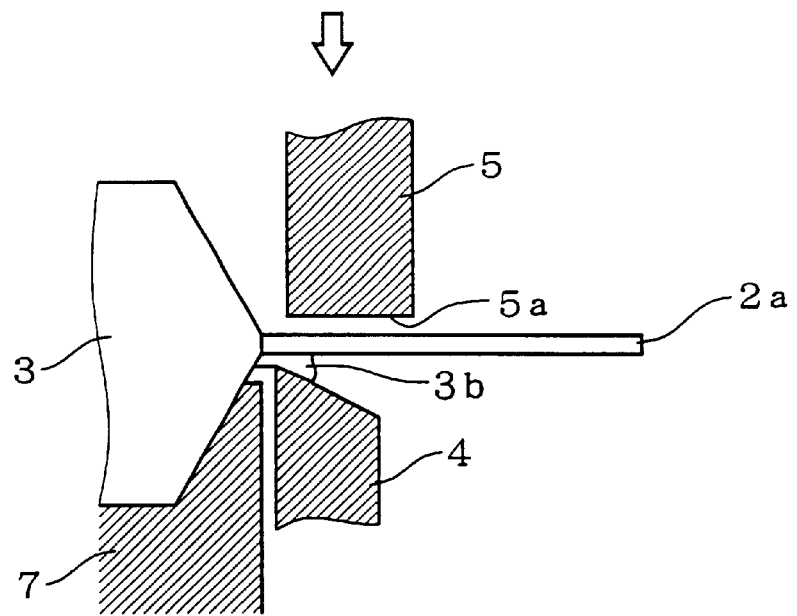
FIG. 1 is a diagram for explaining a step of crushing a lower remaining gate.

First of all, a lead frame 2 is mounted on a frame receiving die 7 as shown in FIG. 1. The frame receiving die 7 fixes a sealing resin 3 of the lead frame 2, and a lead portion does not come in contact with the frame receiving die 7. A lower gate punch 4 comes in contact with a portion on a lower face of a corner 2a which is an unnecessary portion of the lead frame 2 where a remaining gate (a lower remaining gate) 3b is formed.

The remaining gate 3b has such a shape that a bottom portion connected to the sealing resin 3 is flat over a length of about 50 $\mu$m and an end portion is inclined to become more distant from the lead frame 2 at an angle of 30° to 60° to a horizontal plane. The lower gate punch 4 takes a shape having an inclined face corresponding to the inclination. If the lead frame 2 is mounted on the frame receiving die 7, an inclined face of the remaining gate 3b comes in contact with that of the lower gate punch 4. If the lead frame 2 is mounted on the frame receiving die 7, a lead frame presser 5 descends from above corresponding to the lower gate punch 4 with the lead frame 2 interposed therebetween.

Figure 2:
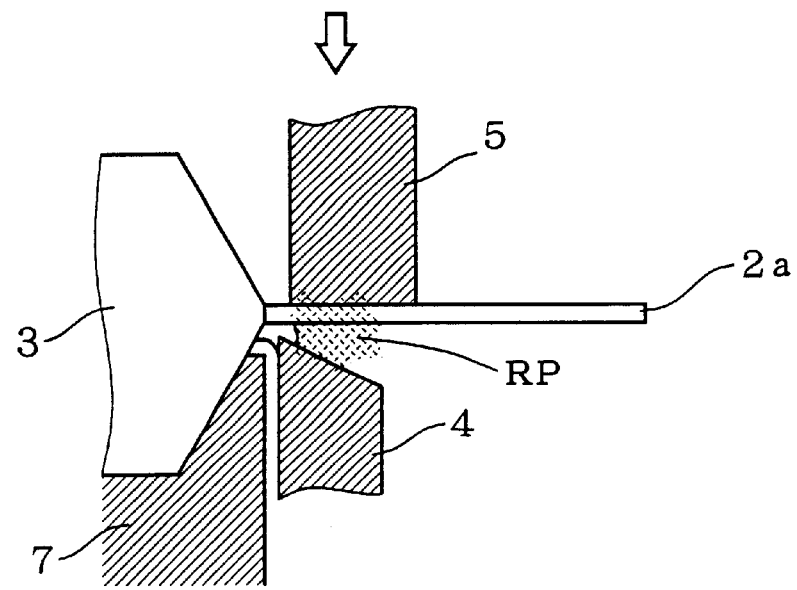
FIG. 2 is a diagram for explaining the step of crushing a lower remaining gate.

The lead frame presser 5 successively descends after it comes in contact with the lead frame 2. As shown in FIG. 2, the remaining gate 3b is started to be crushed. At this time, a resin piece RP is generated by the crushing.

Figure 3:
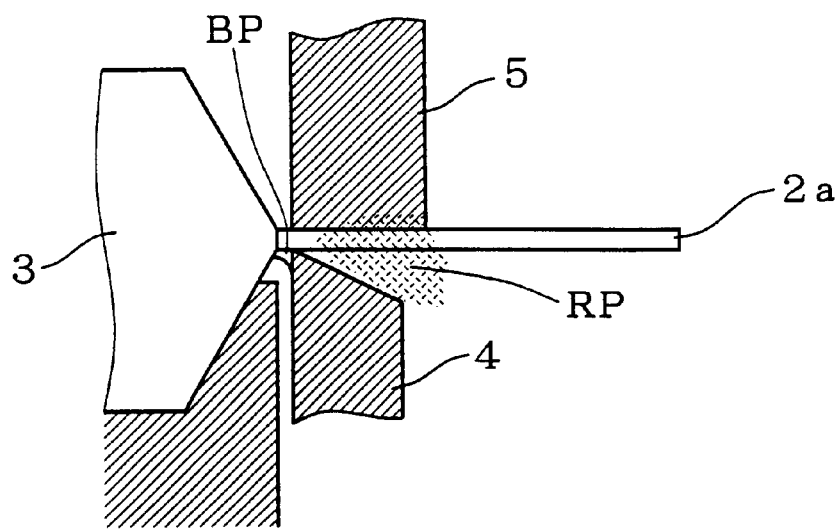
FIG. 3 is a diagram for explaining the step of crushing a lower remaining gate.

As shown in FIG. 3, the lead frame presser 5 descends up to a position where a tip portion of the lower gate punch 4 almost comes in contact with a lower face of the lead frame 2. Consequently, the remaining gate 3b is crushed leaving a bottom portion BP.

Figure 4:
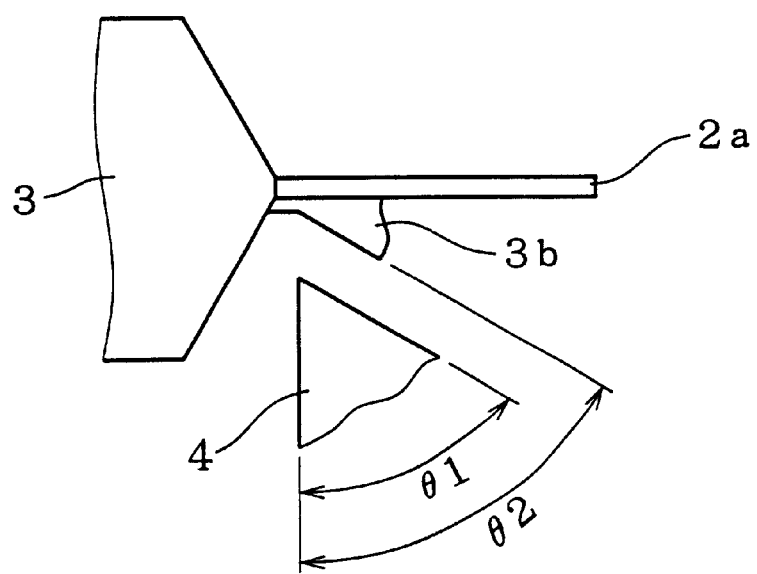
FIG. 4 is a diagram for explaining an inclination of a punch for crushing the lower remaining gate.

Angles of the inclined faces of the lower gate punch 4 and the remaining gate 3b will be described below with reference to FIG. 4. As shown in FIG. 4, $\theta 1$ represents the angle of the inclined face of the lower gate punch 4 and $\theta 2$ represents the angle of the inclined face of the remaining gate 3b. The angle of the inclined face of the lower gate punch 4 is set such that $\theta 1 \geq \theta 2$ is obtained. $\theta 2$ is usually set to about 60°. Therefore, an inclined face portion of the remaining gate 3b can surely be crushed by setting $\theta 1$ to about 60°.

Figure 5:
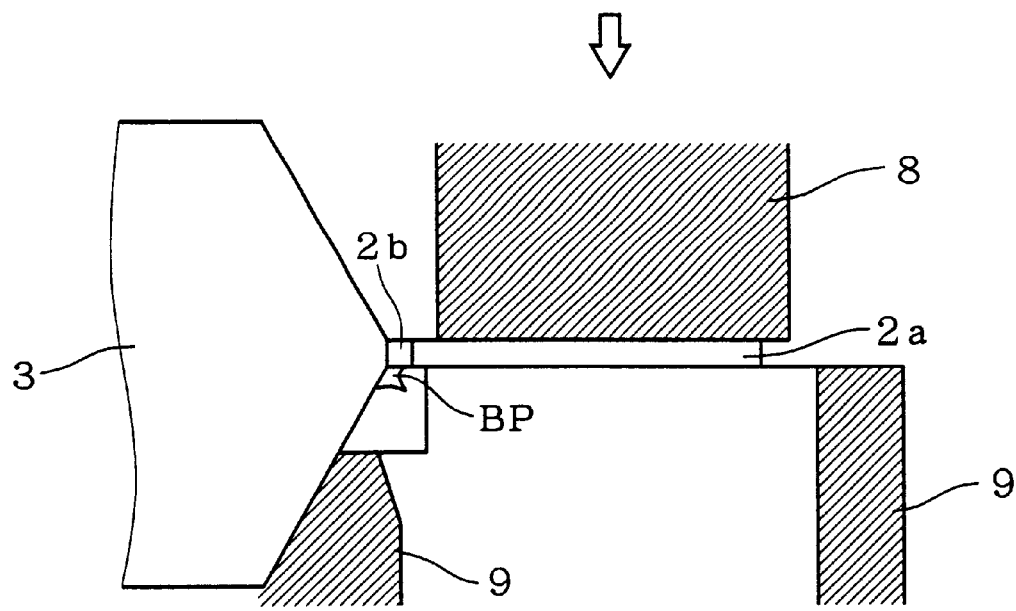
FIG. 5 is a diagram for explaining a pinch cut step performed after crushing the lower remaining gate.

Then, the lead frame 2 is mounted on a die 9 for pinch cut as shown in FIG. 5. In the die 9, only the corner 2a of the lead frame 2 is not supported, and a punch 8 descends from above the corner 2a.

Figure 6:
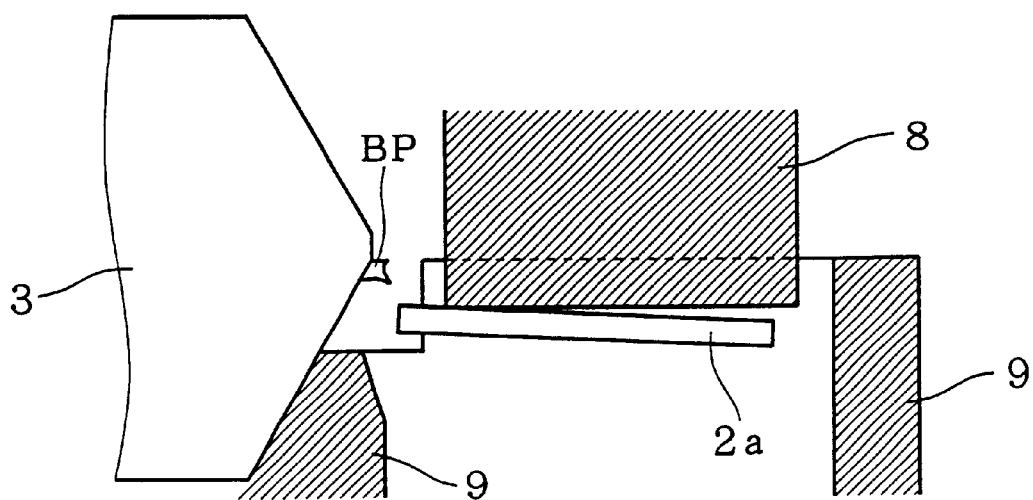
FIG. 6 is a diagram for explaining the pinch cut step performed after crushing the lower remaining gate.
Figure 36:
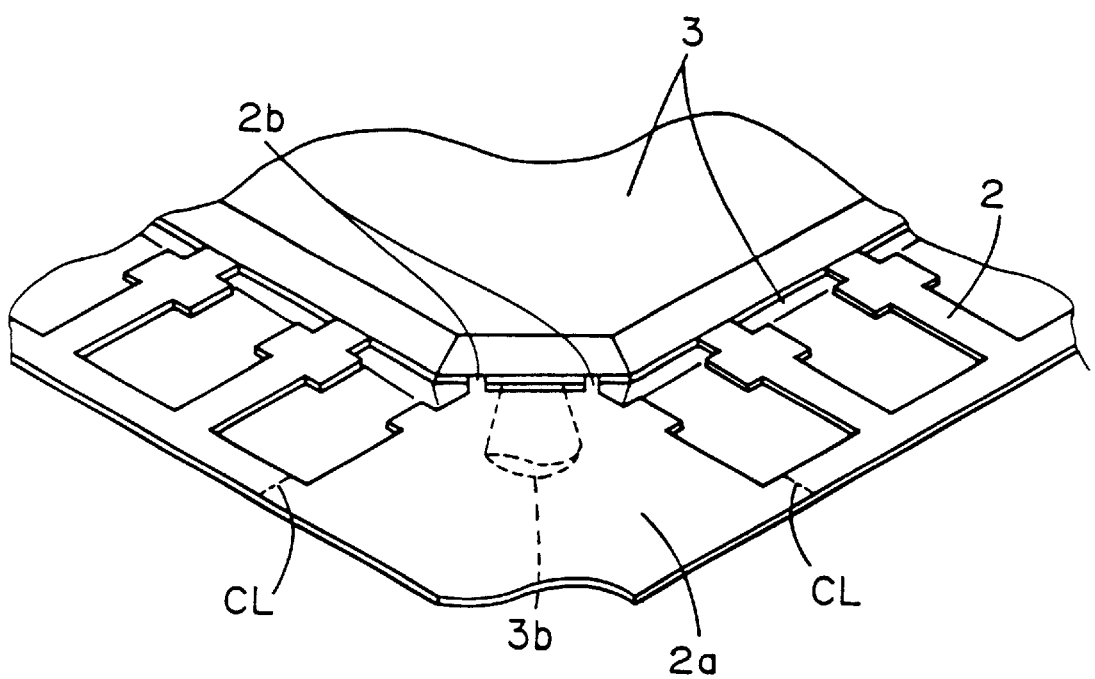
FIG. 36 is a perspective view showing a structure of a lower remaining gate.
Figure 37:
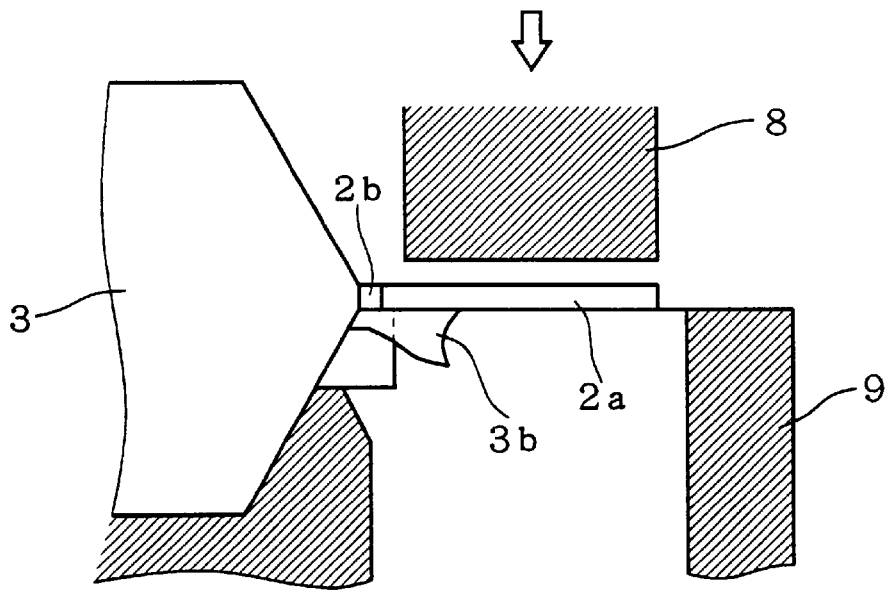
FIG. 37 is a diagram for explaining a step of removing a lower remaining gate according to the prior art.
Figure 38:
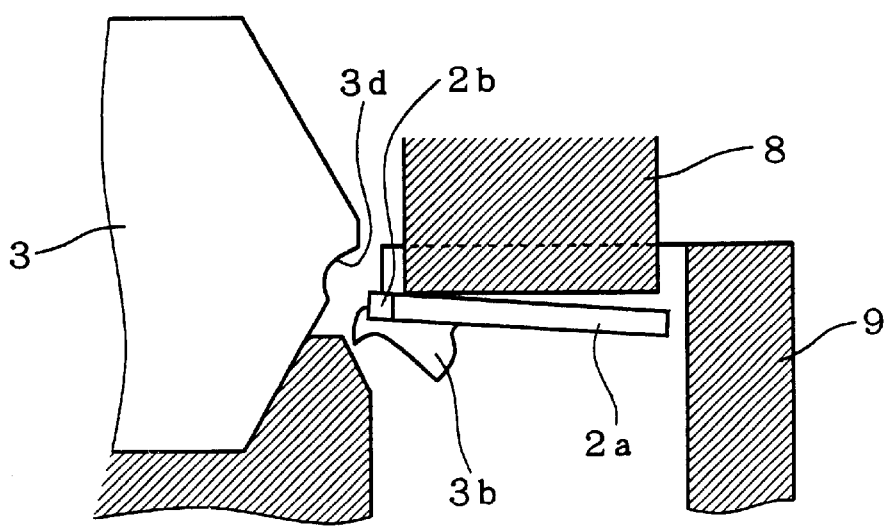
FIG. 38 is a diagram for explaining the step of removing a lower remaining gate according to the prior art.

As shown in FIG. 6, the punch 8 successively descends after it comes in contact with the corner 2a. The lead frame 2 is cut away along the virtual cutting line CL shown in FIG. 36. In this case, since a pinch portion 2b has a small width, it is torn for removal.

<Method for Removing Upper Remaining Gate>

Figure 7:
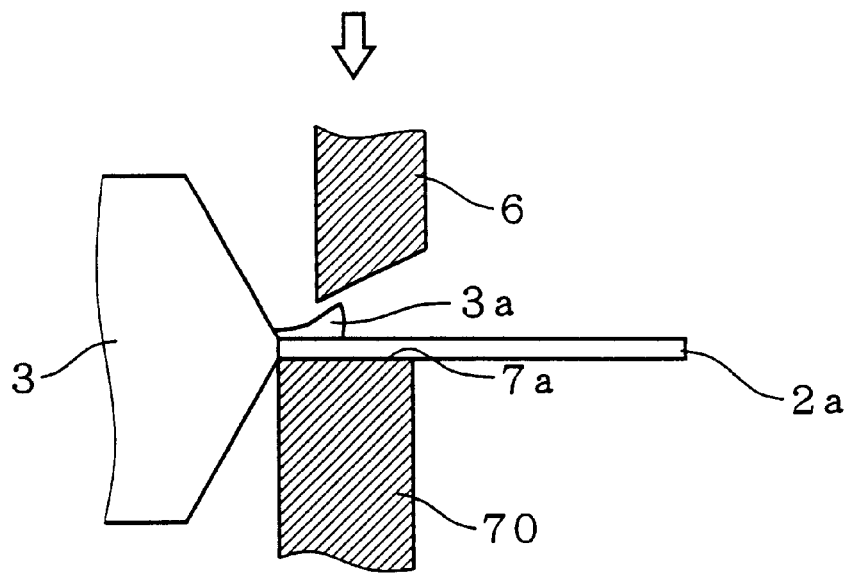
FIG. 7 is a diagram for explaining a step of crushing an upper remaining gate.

First of all, the lead frame 2 is mounted on a frame receiving die 70 as shown in FIG. 7. The frame receiving die 70 fixes the sealing resin 3 of the lead frame 2 and supports a bottom portion in the vicinity of the sealing resin 3 in a lead portion. More specifically, a portion on an upper face of the corner 2a of the lead frame 2 where a remaining gate (an upper remaining gate) 3a is formed is supported on the frame receiving die 70. If the lead frame 2 is mounted on the frame receiving die 70, an upper gate punch 6 descends from above the portion where the remaining gate 3a is formed.

The remaining gate 3a has such a shape that a bottom portion connected to the sealing resin 3 is flat over a length of about 50 μm and an end portion is inclined to become more distant from the lead frame 2 at an angle of 30° to 60° to a horizontal plane. The upper gate punch 6 takes a shape having an inclined face corresponding to the inclination, and comes in contact with an inclined face of the remaining gate 3a by the descent.

Figure 8:
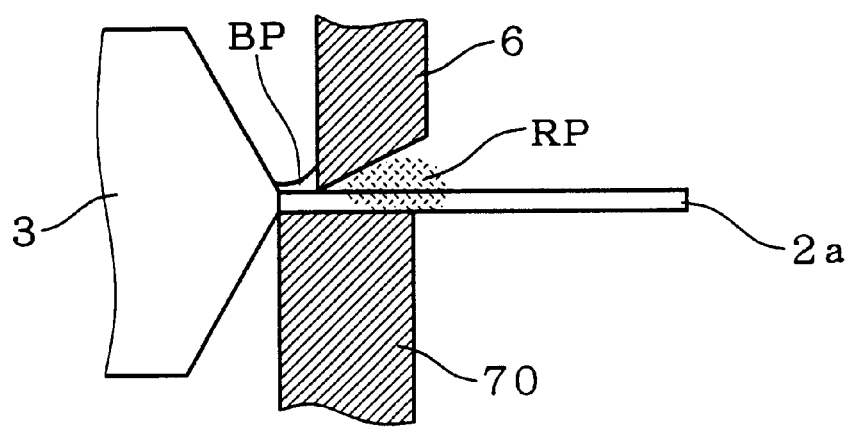
FIG. 8 is a diagram for explaining the step of crushing the upper remaining gate.

The upper gate punch 6 successively descends after it comes in contact with the remaining gate 3a. Consequently, the remaining gate 3a is crushed as shown in FIG. 8. The upper gate punch 6 descends up to a position where a tip portion thereof almost comes in contact with an upper face of the lead frame 2. Consequently, the remaining gate 3a is crushed leaving a bottom portion BP. At this time, a resin piece RP is generated by the crushing.

Figure 9:
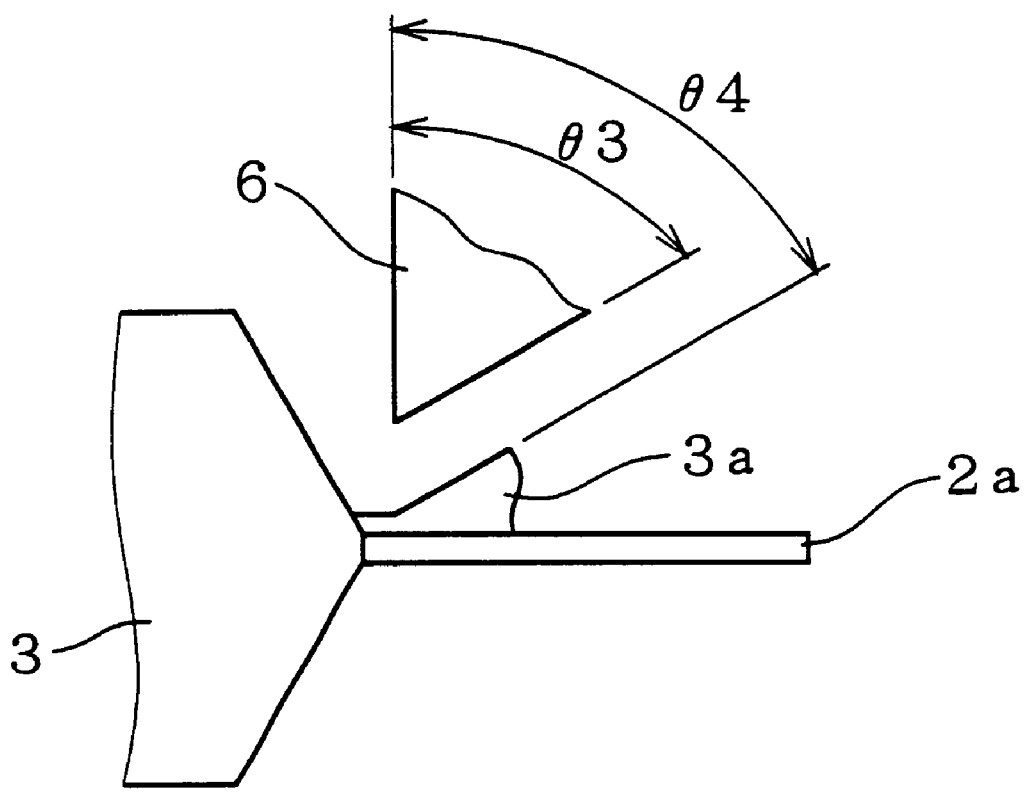
FIG. 9 is a diagram for explaining an inclination of a punch for crushing the upper remaining gate.

Angles of the inclined faces of the upper gate punch 6 and the remaining gate 3a will be described below with reference to FIG. 9. As shown in FIG. 9, θ3 represents the angle of the inclined face of the upper gate punch 6 and θ4 represents the angle of the inclined face of the remaining gate 3a. The angle of the inclined face of the upper gate punch 6 is set such that $\theta 3 \geq \theta 4$ is obtained. θ4 is usually set to about 60°. Therefore, an inclined face portion of the remaining gate 3a can surely be crushed by setting θ3 to about 60°.

Since a subsequent pinch cut step is the same as that of the method for removing a lower remaining gate which has been explained with reference to FIGS. 5 and 6, its description will be omitted.

<Characteristic Function and Effect and Problems>

As described above, the inclined portions of the remaining gates 3a and 3b are crushed prior to the pinch cut step. Consequently, a stress can be prevented from converging on the bottom portions of the remaining gates 3a and 3b at the pinch cut step, and the sealing resin 3 can be prevented from being damaged.

However, the resin piece is generated by crushing the inclined portions of the remaining gates 3a and 3b. Therefore, it is impossible to solve a problem that the resin piece cuts into the sealing resin 3 or sticks to a surface of a lead LD. The inventors have further developed the above-mentioned methods, resulting in the invention of a method for removing a remaining gate which will be described below.

<A. First Embodiment>

A method for manufacturing a semiconductor device according to a first embodiment of the present invention will be described below with reference to FIGS. 10 to 16.

<A-1. Method for Removing Lower Remaining gate>

Figure 10:
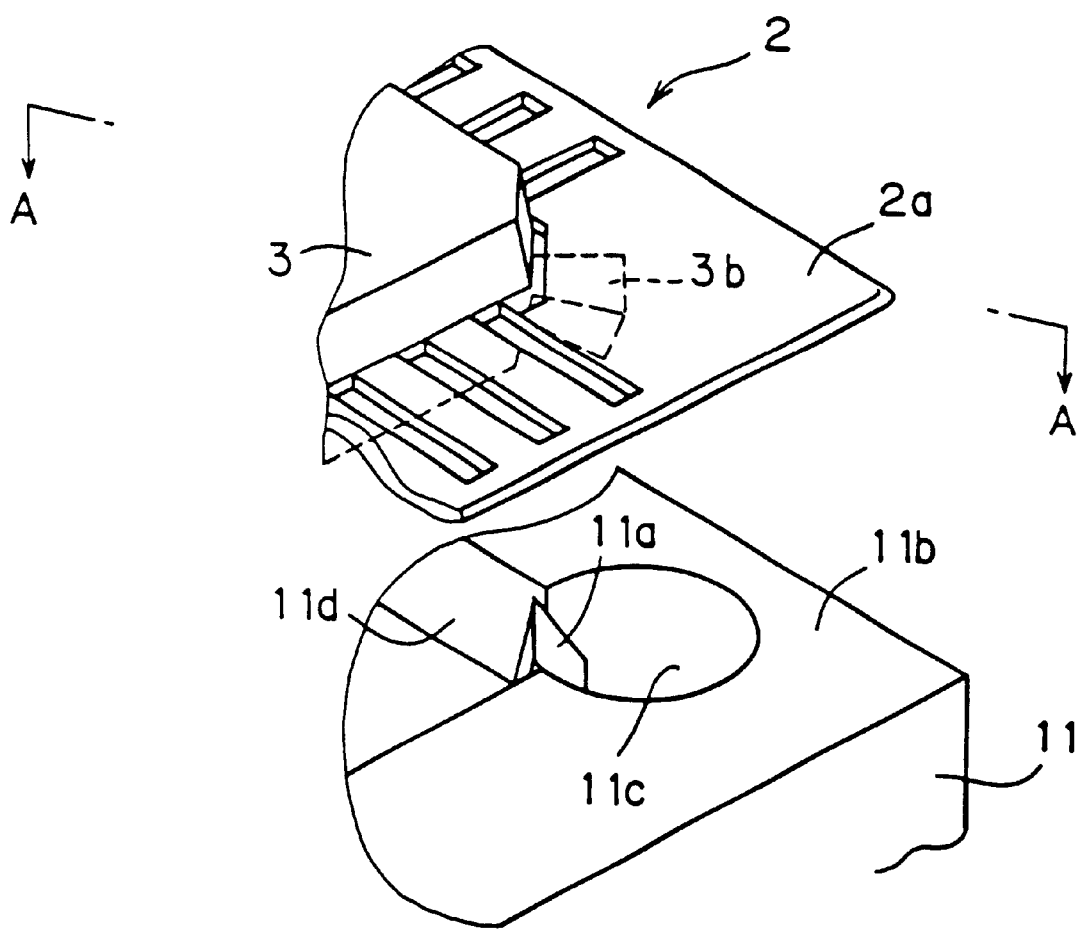
FIG. 10 is a perspective view for explaining a step of forming a crack of the lower remaining gate according to a first embodiment of the present invention.

First of all, a lead frame 2 is mounted on a frame receiving die 11 as shown in FIG. 10. The frame receiving die 11 includes a cavity 11d having a rectangular contour shape seen on a plane which serves to house a sealing resin 3 therein. A remaining gate housing section 11c is provided on one of corners of the cavity 11d which corresponds to a remaining gate 3b on a lower face of a corner (an unnecessary portion) 2a of the lead frame 2. A lower gate punch ha is provided in a boundary portion between the cavity 11d and the remaining gate housing section 11c.

Figure 11:
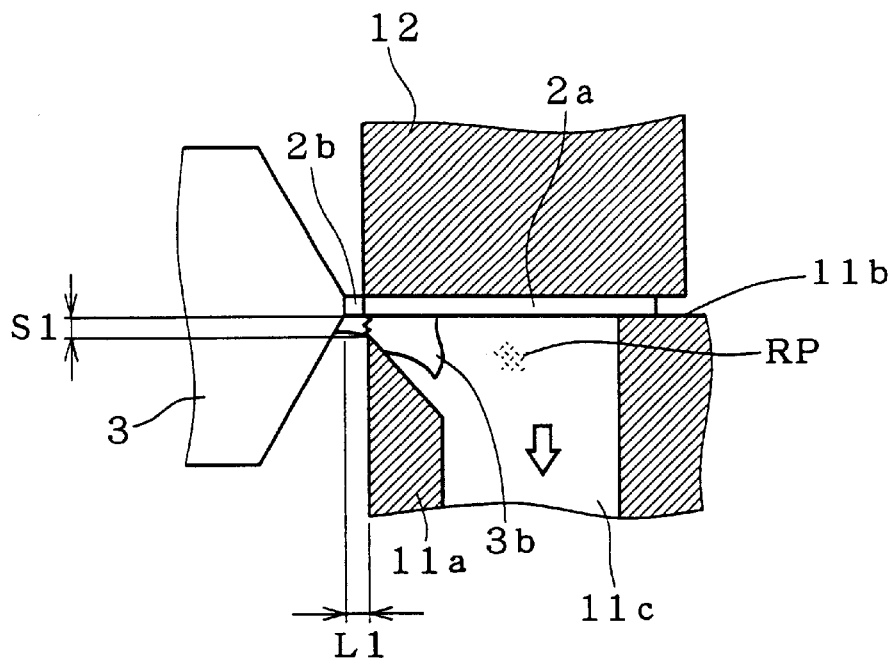
FIG. 11 is a diagram for explaining the step of forming a crack of the lower remaining gate according to the first embodiment of the present invention.

If the lead frame 2 is mounted on the frame receiving die 11, the sealing resin 3 is housed in the cavity 11d and the remaining gate 3b is housed in the remaining gate housing section 11c. However, the remaining gate 3b comes in contact with a tip portion of the lower gate punch 11a. Therefore, the remaining gate 3b is not completely housed in the remaining gate housing section 11c. In this state, a frame presser 12 descends from above the lead frame 2 and comes in contact with an upper face of the lead frame 2. The frame presser 12 successively descends so that the tip portion of the lower gate punch 11a cuts into the remaining gate 3b. When the remaining gate 3b is completely housed in the remaining gate housing section 11c, the frame presser 12 is stopped to descend. This state is shown in FIG. 11. FIG. 11 shows a portion corresponding to a section of each of the lead frame 2 and the frame receiving die 11 taken along the line A—A in FIG. 10.

A structure of the lower gate punch 11a will be described below. As described above, the remaining gate 3b has such a shape that a bottom portion connected to the sealing resin 3 is flat over a length of about 50 μm and an end portion is inclined to become more distant from the lead frame 2 at an angle of 30° to 60° to a horizontal plane. The lower gate punch 11a has an inclined face whose angle is acuter than that of an inclined face of the remaining gate 3b, and has a sharp edge in a tip portion. The tip portion of the lower gate punch 11a is provided in a position (an inner position) which is lower, by a dimension S1, than a press face 11b with which the lead frame 2 comes in contact. The lower gate punch 11a is provided in such a manner that a distance from the most projecting face of the sealing resin 3 to the tip portion of the lower gate punch 11a has a dimension L1 when the sealing resin 3 is housed in the cavity 11d.

Figure 12:
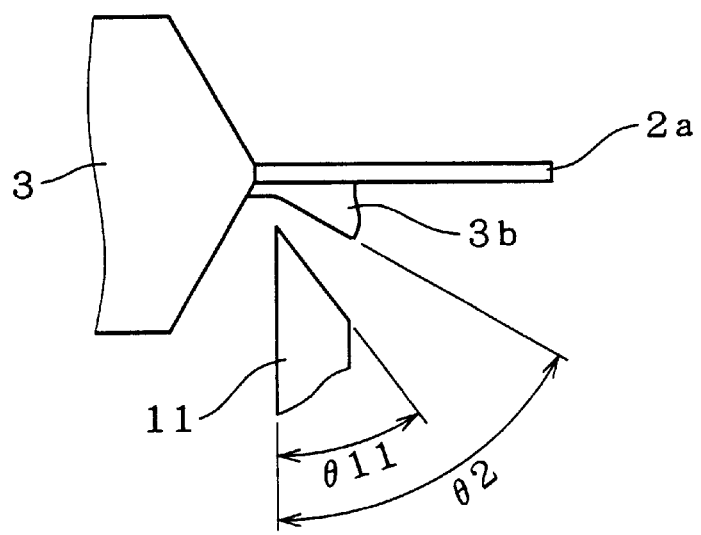
FIG. 12 is a diagram for explaining an inclination of a punch for forming the crack of the lower remaining gate according to the first embodiment of the present invention.

The angles of the inclined faces of the lower gate punch 11a and the remaining gate 3b will be described below with reference to FIG. 12. As shown in FIG. 12, θ11 represents the angle of the inclined face of the lower gate punch 11a and θ2 represents the angle of the inclined face of the remaining gate 3b. The angle of the inclined face of the lower gate punch 11a is set such that $\theta 11 < \theta 2$ is obtained. θ2 is usually set to about 60°. By setting θ11 to about 40° to 45°, therefore, the lower gate punch 11a cuts into the remaining gate 3b without crushing the remaining gate 3b. A quantity of the lower gate punch 11a cutting into the remaining gate 3b desirably generates a crack in a direction perpendicular to a direction of extension of the remaining gate 3b, and is set according to the dimension S1.

More specifically, it is assumed that the lower gate punch 11a should be caused to cut into a flat bottom portion of the remaining gate 3b. The bottom portion has a thickness of about 0.3 mm. Therefore, if the dimension S1 is set to about 0.2 mm, a quantity of the lower gate punch 11a cutting into the bottom portion is about 0.1 mm. Thus, the lower gate punch 11a is caused to cut into the bottom portion up to at least about a third of the thickness of the bottom portion so that the crack can be generated in a residual portion. Accordingly, the above-mentioned process can be referred to as a crack forming step.

The dimension L1 is set in consideration of a dimensional tolerance of the frame receiving die 11 in order to prevent the lower gate punch 11a from damaging the sealing resin 3. More specifically, if the dimensional tolerance of the frame receiving die 11 is set to about 50 μm and the dimension L1 is set to about 70 to 100 μm, the lower gate punch 11a can be prevented from damaging the sealing resin 3.

As shown in FIG. 11, when the tip portion of the lower gate punch 11a cuts into the remaining gate 3b, a small quantity of a resin piece RP is generated. In a state in which the tip portion of the lower gate punch 11a cuts into the remaining gate 3b as shown in FIG. 11, a region defined by the lower gate punch 11a and the remaining gate housing section 11c is covered and sealed with the corner 2a of the lead frame 2. Accordingly, the generated resin piece RP seldom scatters over an outside. In order to further aim at perfection, an inlet port connected to a collecting device which is not shown is provided in the remaining gate housing section 11c. The generated resin piece is collected by air suction in a direction of an arrow shown in FIG. 11. Thus, the resin piece RP can completely be prevented from scattering over the outside.

Figure 13:
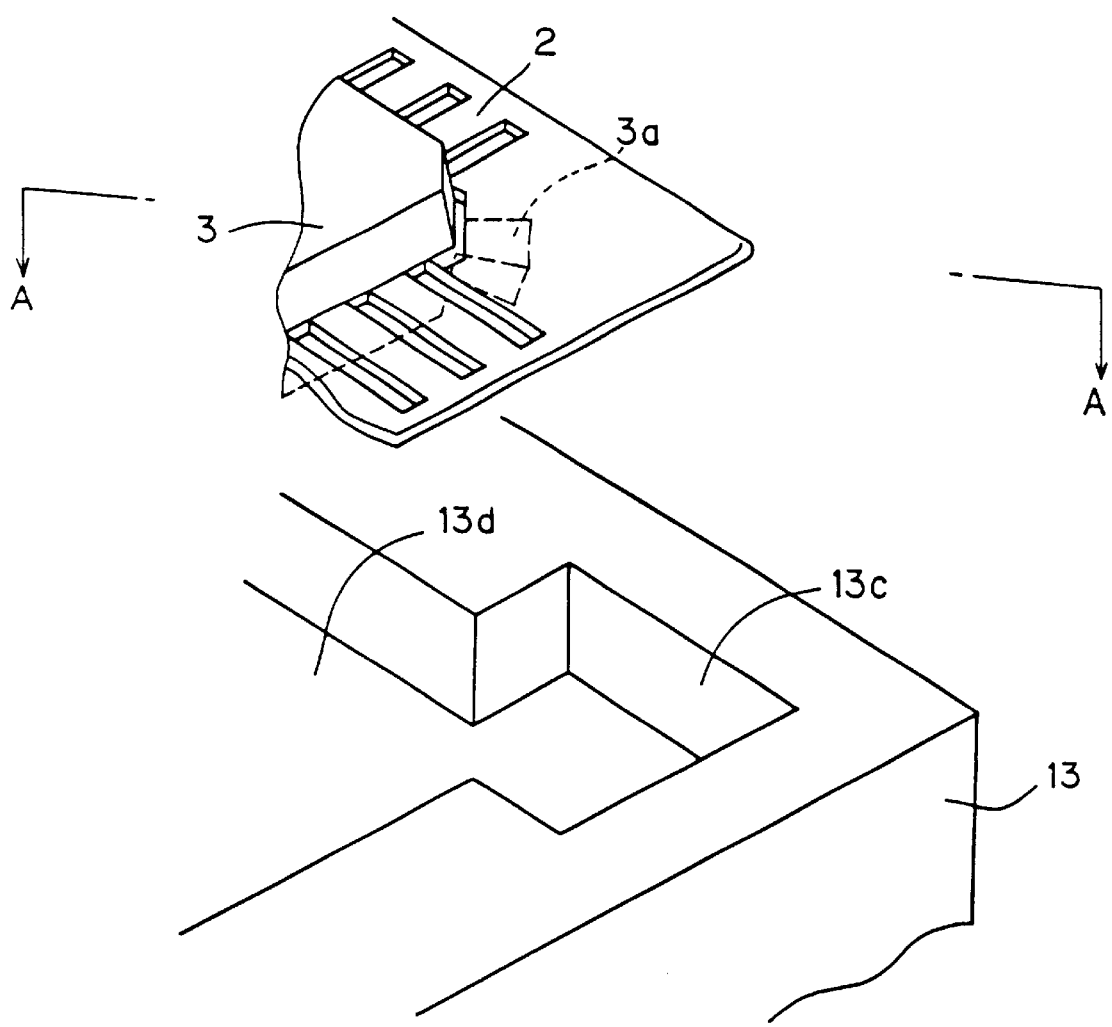
FIG. 13 is a perspective view for explaining a pinch cut step performed after forming the crack.

A pinch cut step is performed after the crack forming step described with reference to FIG. 11. First of all, the lead frame 2 is mounted on a die 13 for pinch cut as shown in FIG. 13. The die 13 includes a cavity 13d having a rectangular contour shape seen on a plane which serves to house the sealing resin 3 therein. A cut substance housing section 13c is provided on four corners of the cavity 13d corresponding to the corners 2a of the lead frame 2.

Figure 14:
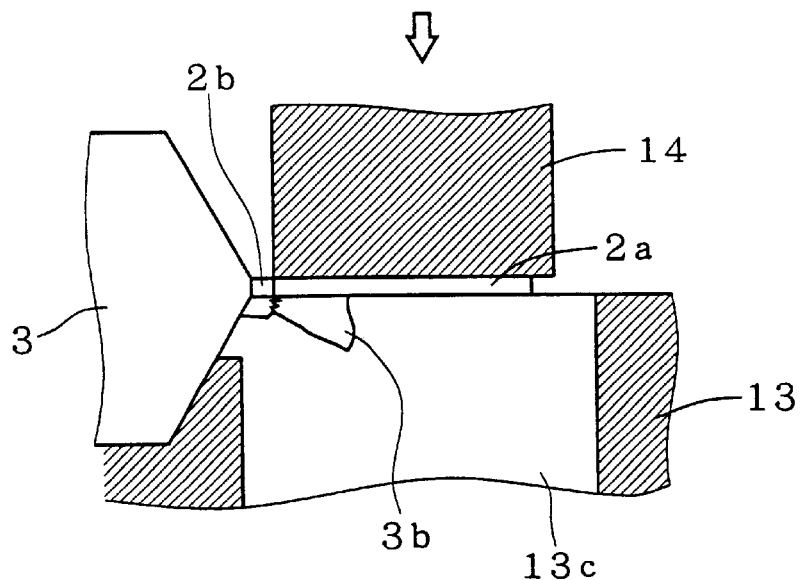
FIG. 14 is a diagram for explaining the pinch cut step performed after forming the crack.

If the lead frame 2 is mounted on the die 13, the sealing resin 3 is housed in the cavity 13d and the remaining gate 3b is housed in the cut substance housing section 13c. In the die 13, only the corner 2a of the lead frame 2 is not supported. In this state, a punch 14 descends from above the lead frame 2 and comes in contact with an upper face of the lead frame 2. This state is shown in FIG. 14. FIG. 14 shows a portion corresponding to a section of each of the lead frame 2 and the die 13 taken along the line A—A in FIG. 13.

Figure 15:
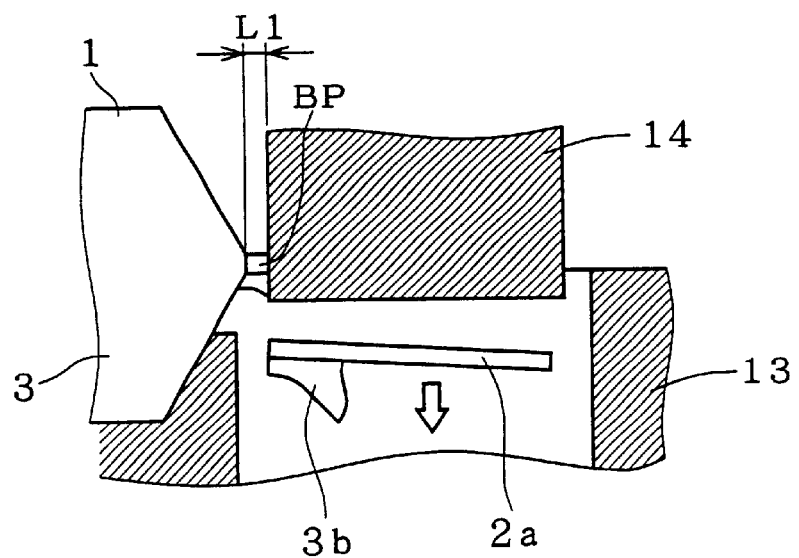
FIG. 15 is a diagram for explaining the pinch cut step performed after forming the crack.

As shown in FIG. 15, the punch 14 successively descends after it comes in contact with the corner 2a. The lead frame 2 is cut along the virtual cutting line CL shown in FIG. 36 so that the corner 2a is removed as an unnecessary portion. Four corners 2a are removed. In this case, since the pinch portion 2b has a small width, the corners 2a are torn for removal. The remaining gate 3b which comes in contact with the corner 2a is also broken off at the same time.

However, the crack is generated on the remaining gate 3b at the crack forming step described with reference to FIG. 11. Therefore, the remaining gate 3b is broken off in the crack portion so that a stress can be prevented from being applied to the bottom portion of the remaining gate 3b. A small quantity of the bottom portion BP of the remaining gate 3b remains on the sealing resin 3. A size of the bottom portion BP is equivalent to the dimension L1 which has been described above and has a set value of about 70 to 100 μm, and does not influence the subsequent steps.

In the cases where the punch 14 descends to cut the corner 2a as shown in FIG. 15 and where the punch 14 ascends after cutting the corner 2a, an edge portion of the punch 14 might come in contact with the bottom portion BP of the remaining gate 3b to generate a small quantity of a resin piece. However, an inlet port connected to a collecting device which is not shown is provided on the die 13. The generated resin piece is collected by air suction in a direction of an arrow shown in FIG. 15. Thus, the resin piece can completely be prevented from scattering over the outside.

<A-1-1. Structure of Punch Preventing Generation of Resin Piece>

Figure 16:
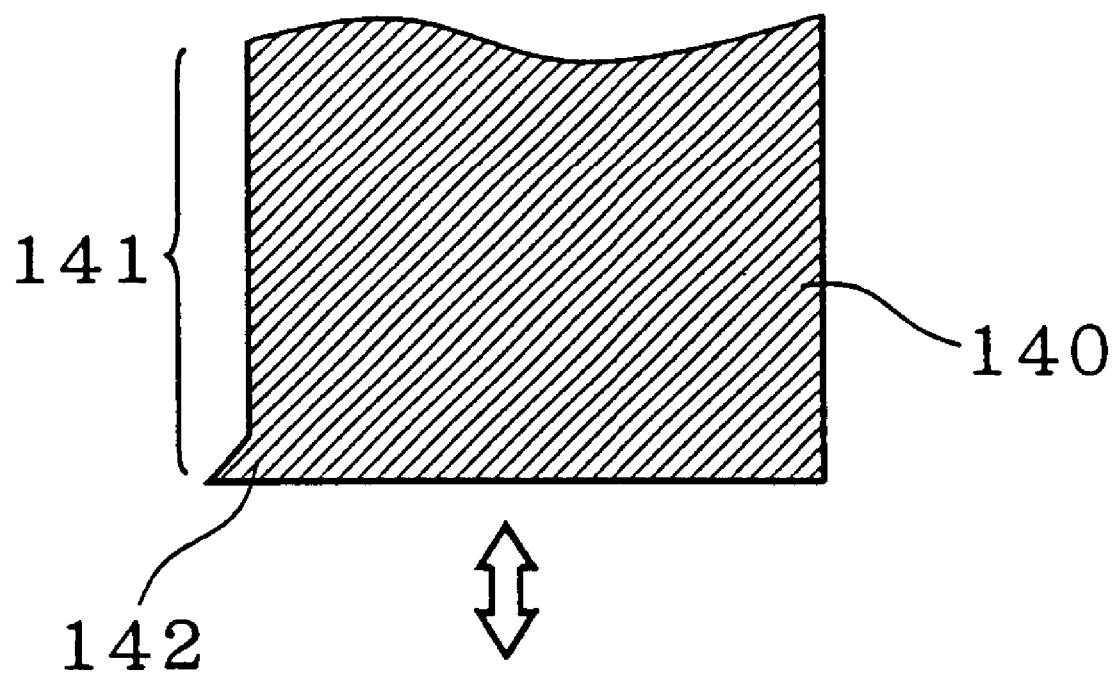
FIG. 16 is a diagram for explaining a structure of a punch for pinch cut.

In order to prevent the resin piece from being generated due to a contact of the edge portion of the punch 14 with the bottom portion BP of the remaining gate 3b as much as possible, a punch 140 having a flank (clearance face) 141 on an edge portion can be used as shown in FIG. 16. According to a structure of the punch 140, a tip portion 142 comes in contact with the bottom portion BP of the remaining gate 3b in a moment when cutting the corner 2a. Since the other portion is the flank 141, the bottom portion BP is prevented from coming in contact therewith. The punch 140 ascends in the same manner. A direction of operation of the punch 140 is shown by an arrow in FIG. 16.

<A-2. Method for Removing Upper Remaining Gate>

Figure 17:
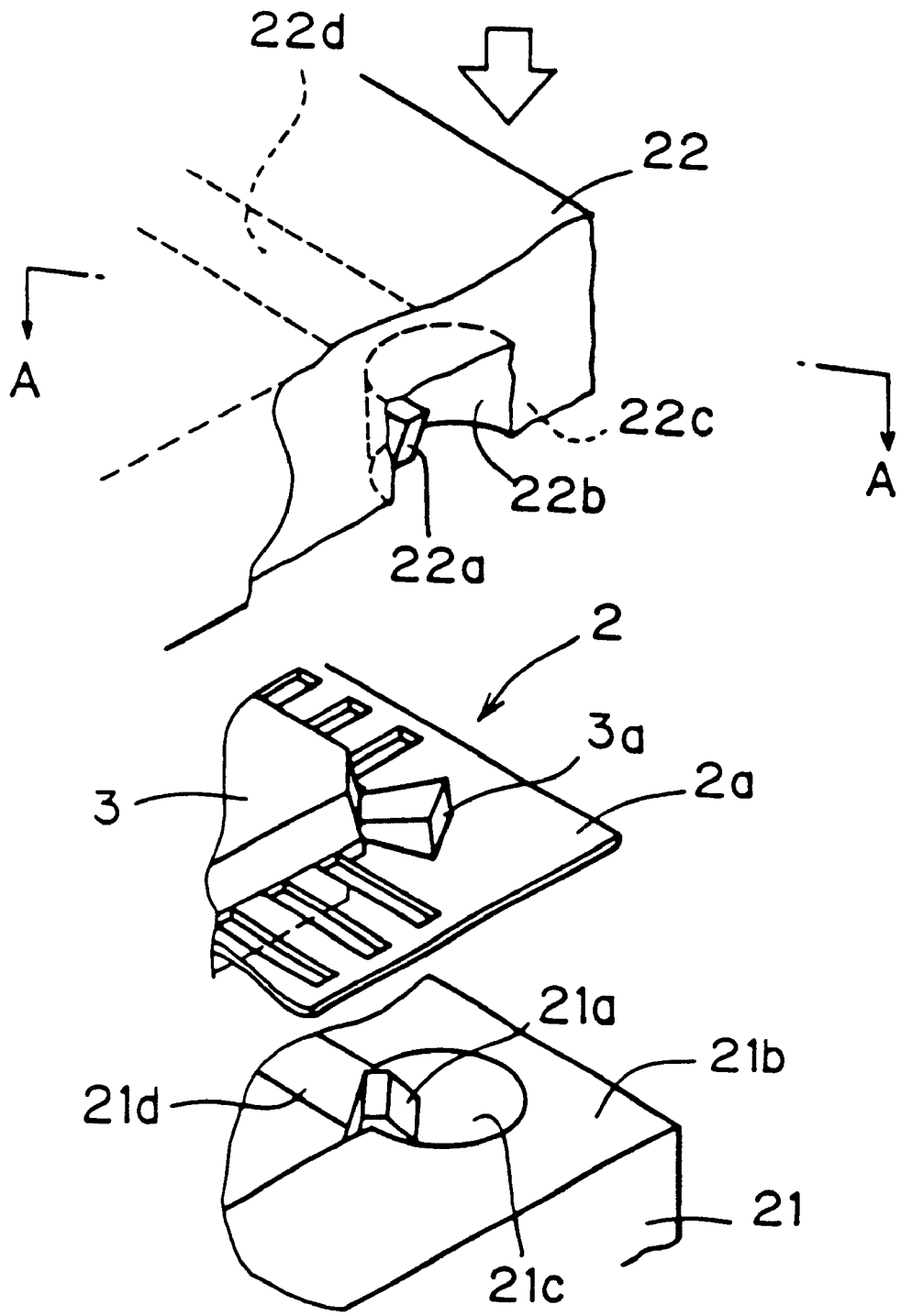
FIG. 17 is a perspective view for explaining a step of forming a crack of the upper remaining gate according to the first embodiment of the present invention.

First of all, the lead frame 2 is mounted on a frame receiving die 21 as shown in FIG. 17. The frame receiving die 21 includes a cavity 21d having a rectangular contour shape seen on a plane which serves to house the sealing resin 3 therein. A collecting port 21c is provided on one of corners of the cavity 21d corresponding to a portion on an upper face of the corner 2a of the lead frame 2 where a remaining gate 3a is formed. A gate support table 21a is provided in a boundary portion between the cavity 21d and the collecting port 21c.

If the lead frame 2 is mounted on the frame receiving die 21, the sealing resin 3 is housed in the cavity 21d and the remaining gate 3a is positioned on the gate support table 21a. In this state, a frame presser 22 descends from above the lead frame 2.

Figure 18:
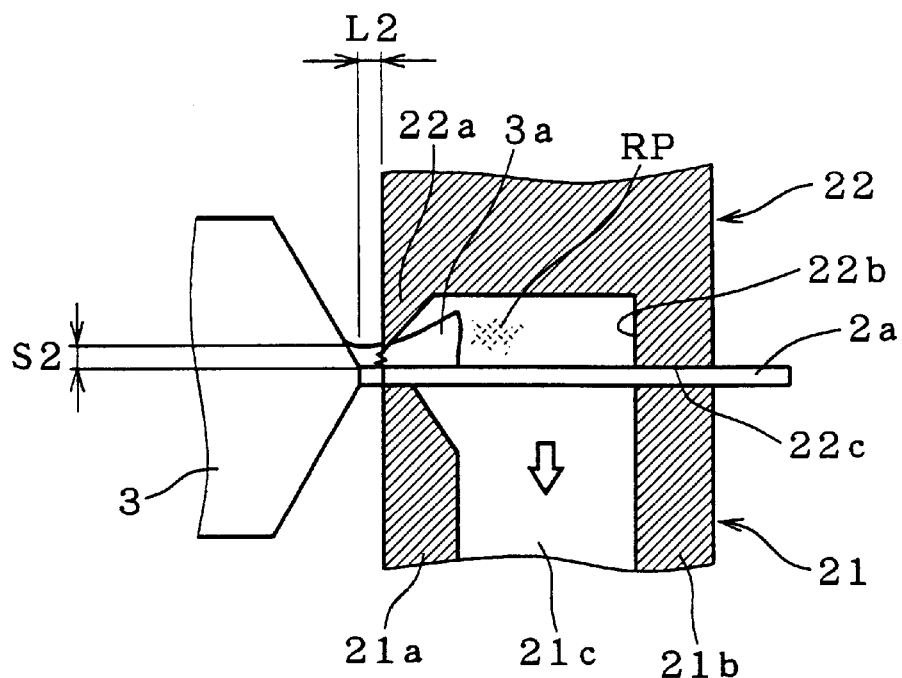
FIG. 18 is a diagram for explaining the step of forming a crack of the upper remaining gate according to the first embodiment of the present invention.

The frame presser 22 includes a cavity 22d having a rectangular contour shape seen on a plane which serves to house the sealing resin 3 therein, a remaining gate housing section 22b for housing the remaining gate 3a, and an upper gate punch 22a for cutting into the remaining gate 3a to generate a crack. A tip portion of the upper gate punch 22a cuts into the remaining gate 3a with the descent. The frame presser 22 success descends. When the tip portion of the upper gate punch 22a cuts into the remaining gate 3a and the remaining gate 3a is completely housed in the remaining gate housing section 22b, the frame presser 22 is stopped to descend. This state is shown in FIG. 18. FIG. 18 shows a portion corresponding to a section of each of the lead frame 2 and the frame receiving die 21 taken along the line A—A in FIG. 17.

A structure of the upper gate punch 22a will be described below. As described above, the remaining gate 3a has such a shape that a bottom portion connected to the sealing resin 3 is flat over a length of about 50 μm and an end portion is inclined to become more distant from the lead frame 2 at an angle of 30° to 60° to a horizontal plane. The upper gate punch 22a has an inclined face whose angle is acuter than that of an inclined face of the remaining gate 3a, and has a sharp edge in a tip portion. The tip portion of the upper gate punch 22a is provided in a position (an inner position) which is higher, by a dimension S2, than a press face 22c with which the lead frame 2 comes in contact. The upper gate punch 22a is provided in such a manner that a distance from the most projecting face of the sealing resin 3 to the tip portion of the upper gate punch 22a has a dimension L2 when the sealing resin 3 is housed in the cavity 22d.

Figure 19:
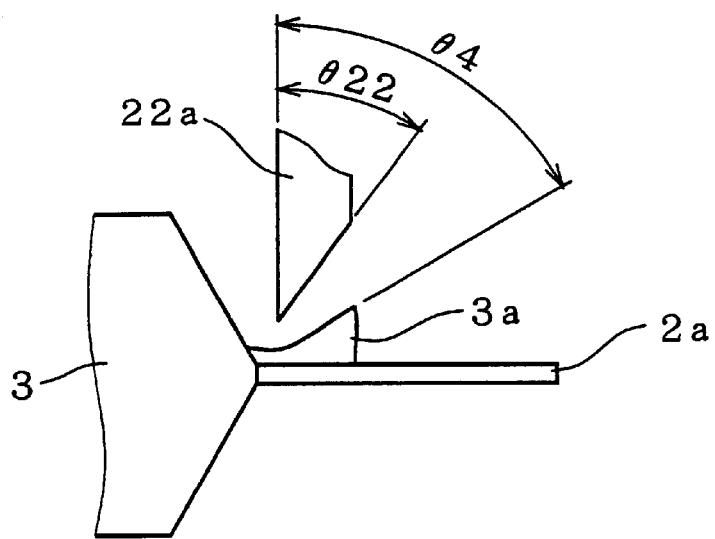
FIG. 19 is a diagram for explaining an inclination of a punch for forming the crack of the upper remaining gate according to the first embodiment of the present invention.

The angles of the inclined faces of the upper gate punch 22a and the remaining gate 3a will be described below with reference to FIG. 19. As shown in FIG. 19, θ22 represents the angle of the inclined face of the upper gate punch 22a and θ4 represents the angle of the inclined face of the remaining gate 3a. The angle of the inclined face of the upper gate punch 22a is set such that θ22<θ4 is obtained. θ4 is usually set to about 60°. By setting θ22 to about 40° to 45°, therefore, the upper gate punch 22a cuts into the remaining gate 3a without crushing the remaining gate 3a. A quantity of the upper gate punch 22a cutting into the remaining gate 3a desirably generates a crack in a direction perpendicular to a direction of extension of the remaining gate 3a, and is set according to the dimension S2.

More specifically, it is assumed that the upper gate punch 22a should be caused to cut into a flat bottom portion of the remaining gate 3a. The bottom portion has a thickness of about 0.3 mm. Therefore, if the dimension S2 is set to about 0.2 mm, a quantity of the upper gate punch 22a cutting into the bottom portion is about 0.1 mm. Thus, the upper gate punch 22a is caused to cut into the bottom portion up to at least about a third of the thickness of the bottom portion so that the crack can be generated in a residual portion. Accordingly, the above-mentioned process can be referred to as a crack forming step.

The dimension L2 is set in consideration of dimensional tolerances of the frame receiving die 21 and the frame presser 22 in order to prevent the upper gate punch 22a from damaging the sealing resin 3. More specifically, if the dimensional tolerances of the frame receiving die 21 and the frame presser 22 are set to about 50 μm and the dimension L2 is set to about 70 to 100 μm, the upper gate punch 22a can be prevented from damaging the sealing resin 3.

As shown in FIG. 18, when the tip portion of the upper gate punch 22a cuts into the remaining gate 3a, a small quantity of a resin piece RP is generated. In a state in which the tip portion of the upper gate punch 22a cuts into the remaining gate 3a as shown in FIG. 18, a region defined by the upper gate punch 22a and the remaining gate housing section 22b is covered and sealed with the corner 2a of the lead frame 2. Accordingly, the generated resin piece RP seldom scatters over an outside. In order to further aim at perfection, an inlet port connected to a collecting device which is not shown is provided in the collecting port 21b of the frame receiving die 21. The generated resin piece RP is collected in a direction of an arrow shown in FIG. 18. Thus, the resin piece RP can completely be prevented from scattering over the outside.

Figure 20:
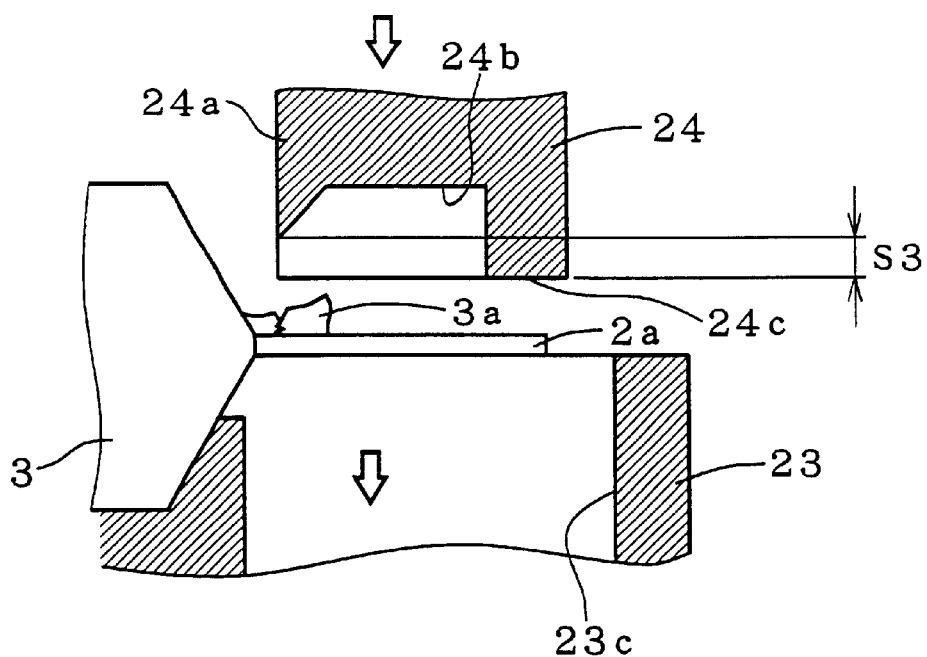
FIG. 20 is a diagram for explaining a pinch cut step performed after forming the crack.

A pinch cut step is performed after the crack forming step described with reference to FIG. 18. First of all, the lead frame 2 is mounted on a die 23 for pinch cut as shown in FIG. 20. A structure of the die 23 is basically the same as that of the die 13 described with reference to FIG. 13, and includes a cavity (not shown) having a rectangular contour shape seen on a plane which serves to house the sealing resin 3 therein. A cut substance housing section 23c is provided on four corners of the cavity corresponding to the corners 2a of the lead frame 2.

If the lead frame 2 is mounted on the die 23, the sealing resin 3 is housed in the cavity. In the die 23, only the corner 2a of the lead frame 2 is not supported. In this state, a lead frame removing punch 24 descends from above the lead frame 2 and comes in contact with an upper face of the lead frame 2. This state is shown in FIG. 20.

The lead frame removing punch 24 includes a remaining gate relief section 24b for housing the remaining gate 3a, and a remaining gate removing punch 24a which comes in contact with the remaining gate 3a. A tip portion of the remaining gate removing punch 24a cuts into the remaining gate 3a with the descent. The tip portion of the remaining gate removing punch 24a is set in a position (an inner position) which is higher, by a dimension S3, than a press face 24c with which the lead frame 2 comes in contact. At the same time that the press face 24c comes in contact with the lead frame 2, the tip portion of the remaining gate removing punch 24a cuts into the remaining gate 3a. The dimension S3 is the same as the dimension S2 of the frame presser 22 which has been described with reference to FIG. 18. The remaining gate removing punch 24a is provided in such a manner that a distance from the most projecting face of the sealing resin 3 to the tip portion of the remaining gate removing punch 24a has a dimension L2.

Figure 21:
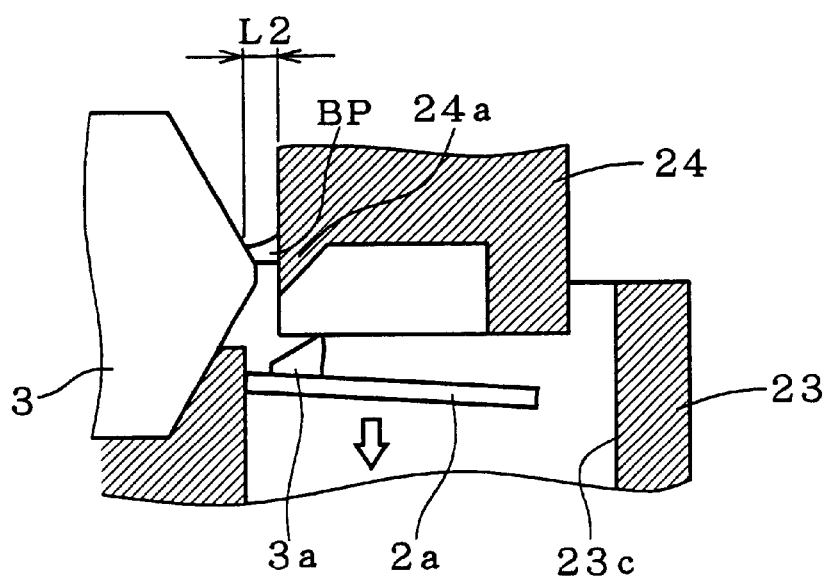
FIG. 21 is a diagram for explaining the pinch cut step performed after forming the crack.
Figure 35:
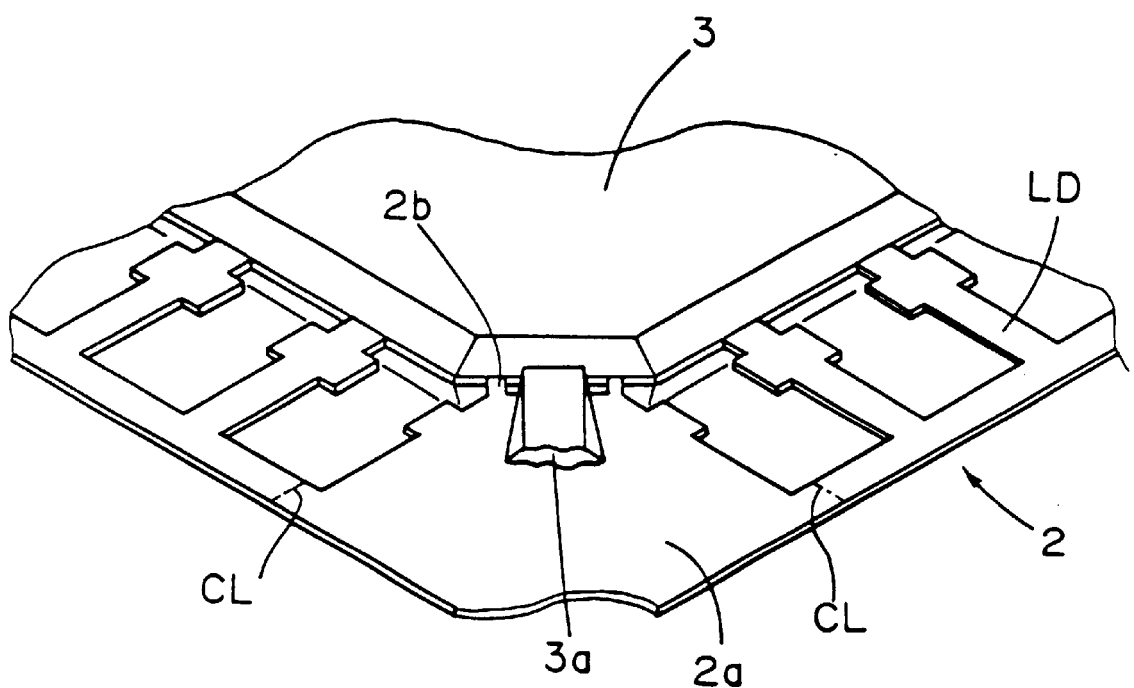
FIG. 35 is a perspective view showing a structure of an upper remaining gate.

As shown in FIG. 21, the lead frame removing punch 24 successively descends after it comes in contact with the corner 2a. The lead frame 2 is cut along the virtual cutting line CL shown in FIG. 35 so that the corner 2a is removed as an unnecessary portion. Four corners 2a are removed. In this case, since a pinch portion 2b has a small width, the corners 2a are torn for removal. The remaining gate 3a which is in contact with the corner 2a is also broken off at the same time.

However, the crack is generated on the remaining gate 3a at the crack forming step described with reference to FIG. 18. Therefore, the remaining gate 3a is broken off in the crack portion so that a stress can be prevented from being applied to the bottom portion of the remaining gate 3a. A small quantity of the bottom portion BP of the remaining gate 3a remains on the sealing resin 3. A size of the bottom portion BP is equivalent to the dimension L2 which has been described above and has a set value of about 70 to 100 μm, and does not influence the subsequent steps.

Figure 22:
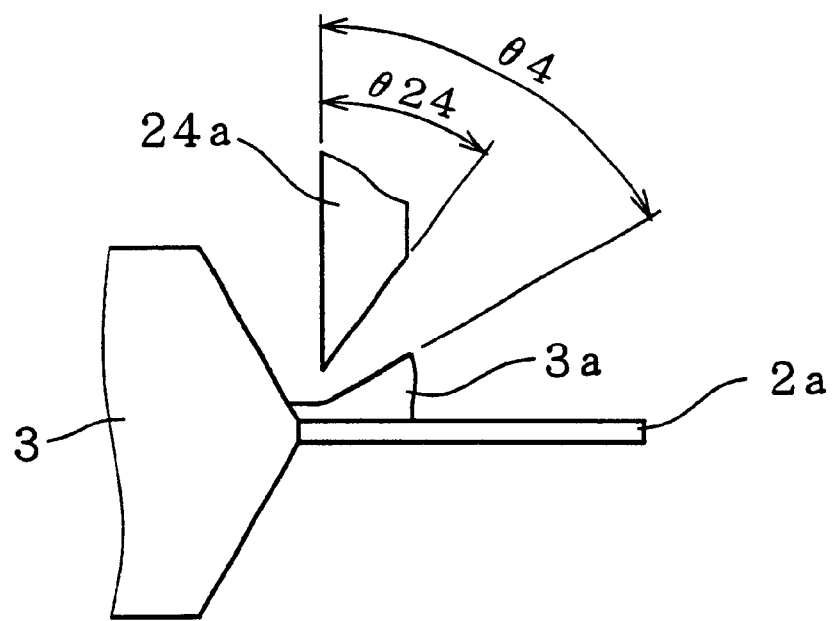
FIG. 22 is a diagram for explaining an inclination of a punch for pinch cut.

A structure of the remaining gate removing punch 24a will be described below. As described above, the remaining gate 3a has such a shape that a bottom portion connected to the sealing resin 3 is flat over a length of about 50 μm and an end portion is inclined to become more distant from the lead frame 2 at an angle of 30° to 60° to a horizontal plane. The remaining gate removing punch 24a has an inclined face whose angle is acuter than that of an inclined face of the remaining gate 3a. FIG. 22 shows a relationship between the angles of the inclined faces of the remaining gate removing punch 24a and the remaining gate 3a. As shown in FIG. 22, θ24 represents the angle of the inclined face of the remaining gate removing punch 24a and θ4 represents the angle of the inclined face of the remaining gate 3a. The angle of the inclined face of the remaining gate removing punch 24a is set such that θ24<θ4 is obtained. θ4 is usually set to about 60°. By setting θ24 to about 40° to 45°, therefore, the remaining gate removing punch 24a cuts into the remaining gate 3a without crushing the remaining gate 3a.

In the cases where the lead frame removing punch 24 descends to cut the corner 2a as shown in FIG. 21 and where the lead frame removing punch 24 ascends after cutting the corner 2a, an edge portion of the lead frame removing punch 24 might come in contact with the bottom portion BP of the remaining gate 3a to generate a small quantity of a resin piece. However, an inlet port connected to a collecting device which is not shown is provided on the die 23. The generated resin piece is collected in a direction of an arrow shown in FIG. 21. Thus, the resin piece can completely be prevented from scattering over the outside.

<A-2-1. Structure of Punch Preventing Generation of Resin Piece>

Figure 23:
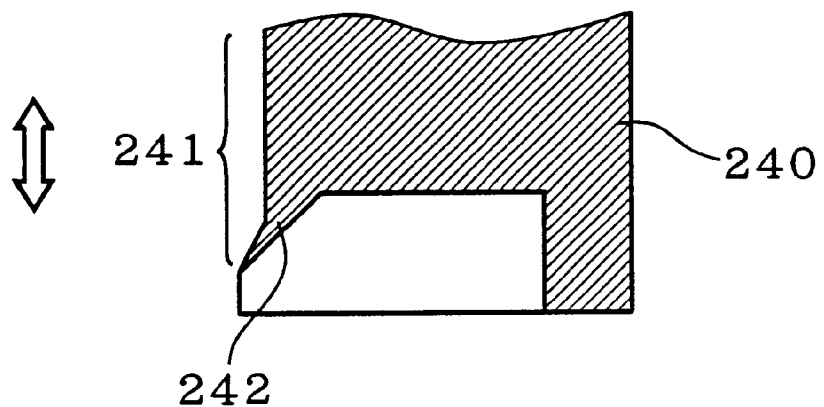
FIG. 23 is a diagram for explaining a structure of the punch for pinch cut.

In order to prevent the resin piece from being generated due to a contact of the edge portion of the lead frame removing punch 24 with the bottom portion BP of the remaining gate 3a as much as possible, a lead frame removing punch 240 having a flank (clearance face) 241 on an edge portion can be used as shown in FIG. 23. According to a structure of the lead frame removing punch 240, a tip portion 242 comes in contact with the bottom portion BP of the remaining gate 3a in a moment when cutting the corner 2a. Since the other portion is the flank 241, the bottom portion BP is prevented from coming in contact therewith. The lead frame removing punch 240 ascends in the same manner. A direction of operation of the lead frame removing punch 240 is shown by an arrow in FIG. 23.

<A-3. Characteristic Function and Effect>

According to the first embodiment of the present invention described above, the method comprises the step of forming the crack in the bottom portion of the remaining gate prior to the pinch cut step. Consequently, in the case where the remaining gate is broken off at the pinch cut step, the remaining gate is broken off in the crack portion so that a stress can be prevented from being applied to the bottom portion of the remaining gate. Thus, the sealing resin can be prevented from being damaged and the resin piece can be inhibited from being generated.

<A-4. Variant>

Figure 24:
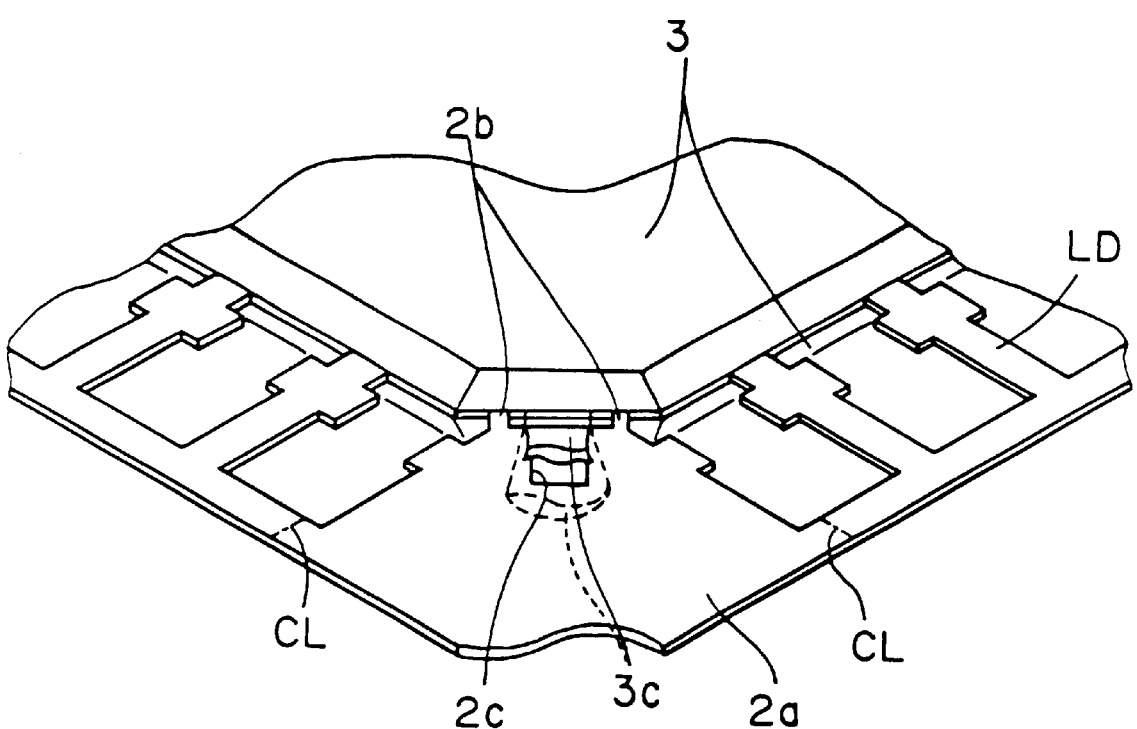
FIG. 24 is a perspective view for explaining a remaining gate formed by an intermediate gate method.

While the removal of the remaining gates formed by the upper and lower gate methods has been described above, the present invention may also be applied to removal of a remaining gate formed by an intermediate gate method. FIG. 24 shows a structure of a remaining gate 3c formed by the intermediate gate method.

As shown in FIG. 24, a rectangular notch 2c is formed on the corner 2a of the lead frame 2 in the vicinity of the sealing resin 3. The notch 2c is provided corresponding to a gate through which a resin is poured into a cavity at a resin sealing step. The resin also remains in the notch 2c after it is cured. Such a structure is employed to reduce a thickness of the remaining gate 3c as much as possible. It is ideal that the resin remains only in the notch 2c. Actually, the resin overflows vertically from the notch 2c so that the remaining gate 3c is formed.

In order to remove the remaining gate 3c, it is preferable that the frame receiving die 11 described with reference to FIGS. 10 and 11 should be combined with the frame presser 22 described with reference to FIGS. 17 and 18.

Figure 25:
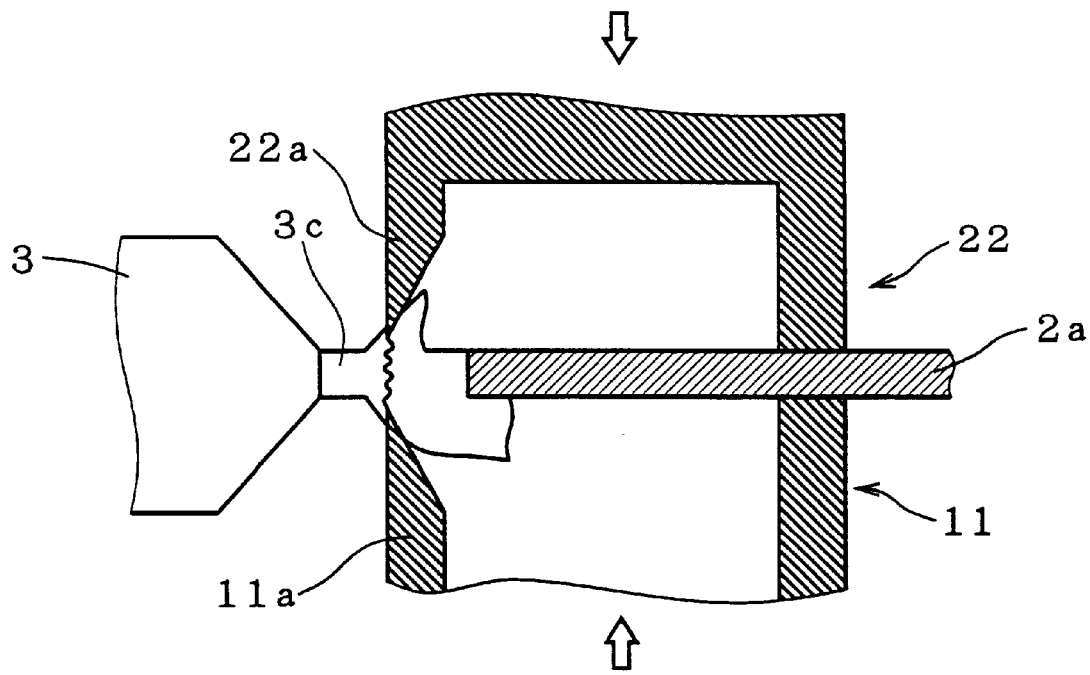
FIG. 25 is a diagram for explaining a step of forming a crack of the remaining gate formed by the intermediate gate method.

More specifically, the lead frame 2 is mounted on the frame receiving die 11 as shown in FIG. 25. The frame presser 22 is caused to descend so that upper and lower gate punches 22a and 11a are caused to cut into the remaining gate 3c from upper and lower sides of the remaining gate 3c. Thus, a crack is generated. The method for removing an upper remaining gate or the method for removing a lower remaining gate which has been described above is employed at the subsequent pinch cut step. Consequently, the remaining gate 3c is broken off in the crack portion so that a stress can be prevented from being applied to the bottom portion of the remaining gate. Thus, the sealing resin 3 can be prevented from being damaged and the resin piece can be inhibited from being generated.

<B. Second Embodiment>

In the method for removing a lower remaining gate according to the first embodiment of the present invention described above, the cavity 11d and the remaining gate housing section 11c of the frame receiving die 11 are fixed. However, the cavity and the remaining gate housing section may be movable in respect of prevention of scattering of a resin piece.

Figure 26:
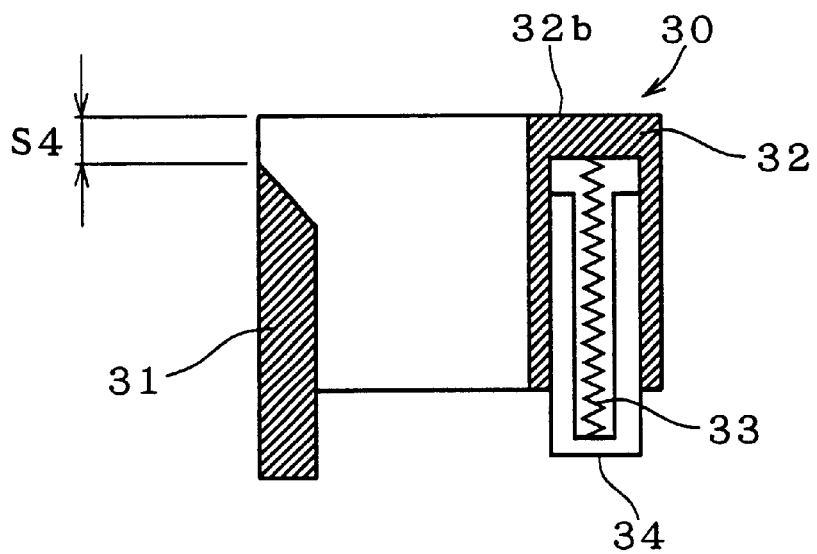
FIG. 26 is a diagram showing a structure of a frame receiving die according to a second embodiment of the present invention.

FIG. 26 shows a structure of a frame receiving die 30 in which a cavity and a remaining gate housing section are movable. As shown in FIG. 26, the frame receiving die 30 includes a body section 32 forming the cavity and the remaining gate housing section, an elastic member 33 for forcing the body section 32 in an upper direction, a slide guide 34 inserted in a lower portion of the body section 32 for housing the elastic member 33, and a lower gate punch 31 which is fixed.

The body section 32 has a groove on a face opposite to a press face 32b which comes in contact with a lead frame 2. The slide guide 34 housing the elastic member 33 is inserted in the groove. The elastic member 33 forces the body section 32 in the upper direction, and the slide guide 34 and the body section 32 are slidably formed. In a state in which the body section 32 is not loaded, a distance between the press face 32b and a tip portion of the lower gate punch 31 is set to S4. The lower gate punch 31 and the slide guide 34 are fixed to a predetermined board, which is not shown.

Figure 27:
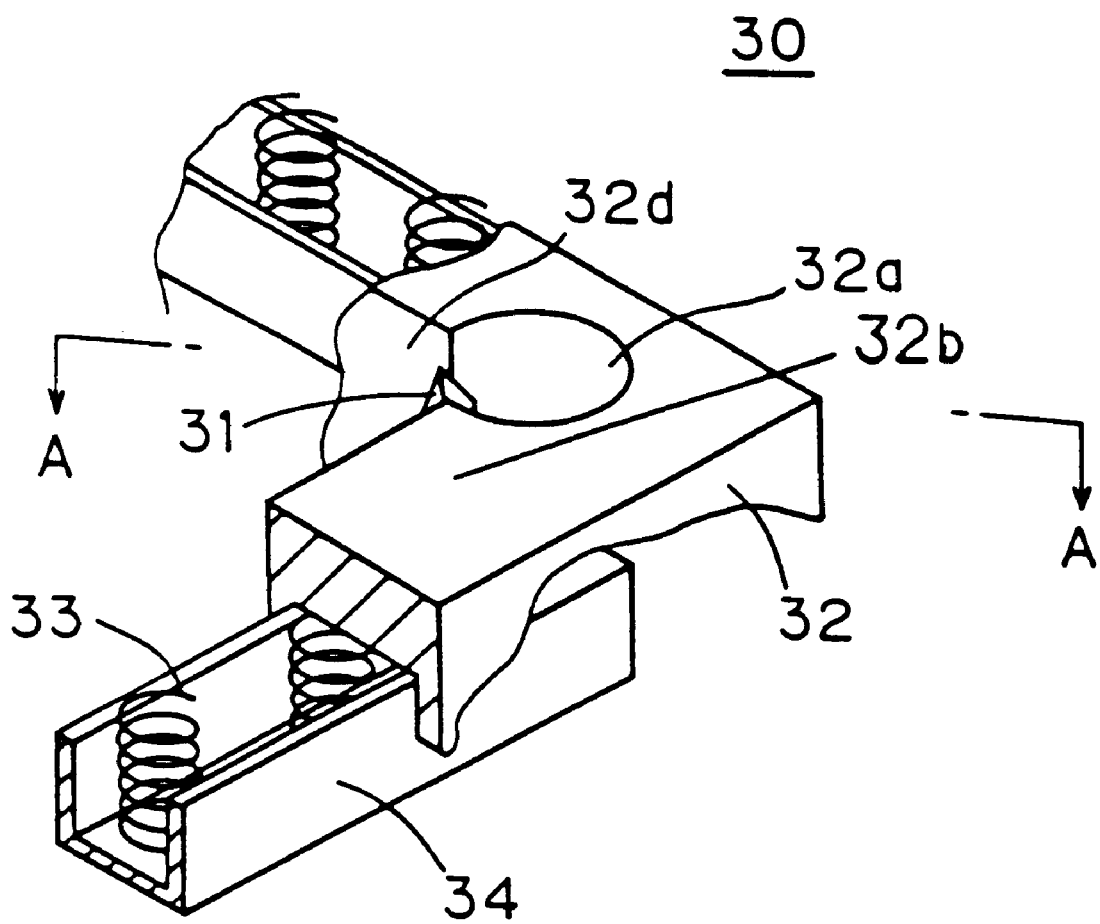
FIG. 27 is a perspective view showing the structure of the frame receiving die according to the second embodiment of the present invention.

FIG. 27 is a perspective view partially showing the structure of the frame receiving die 30. As shown in FIG. 27, a plurality of elastic members 33 are housed in the slide guide 34 to push up the body section 32 forming a cavity 32d and a remaining gate housing section 32a. A section taken along the line A—A in FIG. 27 corresponds to FIG. 26.

When the lead frame 2 is mounted on the frame receiving die 30 having such a structure, it tightly comes in contact with the press face 32b of the body section 32. With this state kept, the frame presser 12 descends so that a remaining gate 3b is pushed against the tip portion of the lower gate punch 31. Consequently, a resin piece generated when the tip portion of the lower gate punch 31 cuts into the remaining gate 3b can completely be prevented from scattering.

The dimension S4 is set in such a manner that the remaining gate 3b does not come in contact with the tip portion of the lower gate punch 31 with the lead frame 2 mounted. For example, the dimension S4 has a value of 1 mm.

In general, a spring is used for the elastic member 33. A rubber or an air spring may be used for the elastic member 33.

Also in the case where this structure is applied to the frame presser 22 described with reference to FIGS. 17 and 18, the same function and effect can be obtained.

While the structure in which the remaining gate is formed on the corner of the lead frame and the corner of the lead frame is removed as an unnecessary portion has been described by taking the quad flat package (QFP) as an example in the first and second embodiments of the present invention, the present invention is not restricted to the QFP but can be applied to any type of resin sealing semiconductor device.

In the case where the remaining gate should be removed, a crack is formed in a predetermined position of the remaining gate. If the remaining gate is broken off in the crack portion when the unnecessary portion of the lead frame is removed, the sealing resin can be prevented from being damaged and generation of a resin piece can be reduced.

<C. Third Embodiment>

While a reduction in the resin piece generated when the remaining gate is removed and prevention of damage of the sealing resin have been described in the first and second embodiments of the present invention, the inventors also provide the following structure in respect of the reduction in the resin piece.

<C-1. Structure of Press Die>

Figure 28:
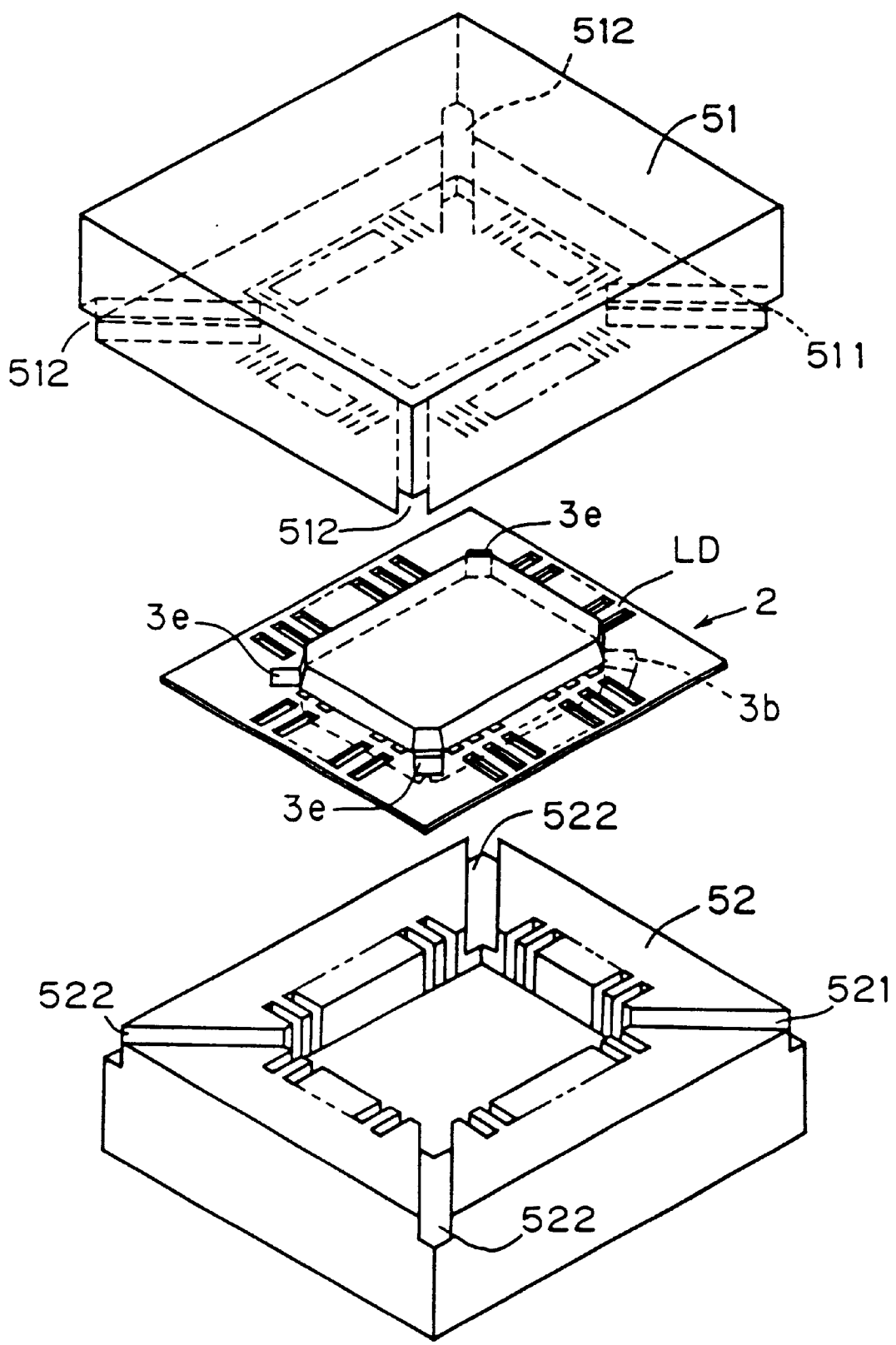
FIG. 28 is a perspective view for explaining a press die according to a third embodiment of the present invention.

FIG. 28 shows structures of upper and lower dies 51 and 52 acting as press dies when a tie bar cut step of a lead frame 2 is performed. As shown in FIG. 28, tie bar cut is performed with the lead frame 2 interposed between the upper and lower dies 51 and 52. A remaining gate 3b and a remaining air vent 3e extend from a corner of a sealing resin 3 to a surface of the lead frame 2. Therefore, a clearance groove is formed on the upper and lower dies 51 and 52.

More specifically, the upper die 51 has a gate clearance groove 511 formed in a position corresponding to the remaining gate 3b, and an air vent clearance groove 512 formed in a position corresponding to the remaining air vent 3e.

Furthermore, the lower die 52 has a gate clearance groove 521 formed in a position corresponding to the remaining gate 3b, and an air vent clearance groove 522 formed in a position corresponding to the remaining air vent 3e.

The gate clearance groove 511 and the air vent clearance groove 512 are formed along a diagonal line from a corner of a cavity for housing the sealing resin 3 of the lead frame 2.

The remaining air vent 3e exists on upper and lower faces of the lead frame 2 in three corners except a corner where a remaining gate 3a (or the remaining gate 3b) is formed. Therefore, the air vent clearance groove 512 is formed on the three corners, respectively.

When the lead frame 2 is interposed between the upper and lower dies 51 and 52, the remaining gate 3b is enclosed by the gate clearance groove 521 and the remaining air vent 3e is enclosed by the air vent clearance grooves 512 and 522. Therefore, even if the upper and lower dies 51 and 52 overlap by press molding operation, the remaining gate 3b (or 3a) and the remaining air vent 3e can be prevented from being crushed.

Accordingly, the generation of the resin piece can be reduced more than in the press die according to the prior art in which the remaining gate and the remaining air vent are crushed during press molding so that the resin piece is generated. Consequently, there can be less possibility that the resin piece might cut into the sealing resin 3 or stick to a lead LD at another press step in the case where a processing proceeds to the same press step with the resin piece adhering to the sealing resin 3 or the lead LD.

While the press die used when performing the tie bar cut step has been described above, it is needless to say that the present invention may be applied to other press dies. More specifically, in the case where there is a possibility that the remaining gate and the remaining air vent might be crushed by the press molding operation, the clearance groove is provided by application of the present invention. Consequently, the same function and effect as described above can be obtained.

In order to protect the remaining gate and the remaining air vent, the structure of the groove shown in FIG. 28 is not restricted but openings such as the remaining gate housing section 11c and the collecting port 21c shown in FIGS. 10 and 17 may be used. While a structure for protecting the remaining air vent has not been described in the first and second embodiments, it is needless to say that a groove or an opening for protecting the remaining air vent may be provided.

<C-2. Structure of Guide Rail for Carrying Lead Frame>

Figure 29:
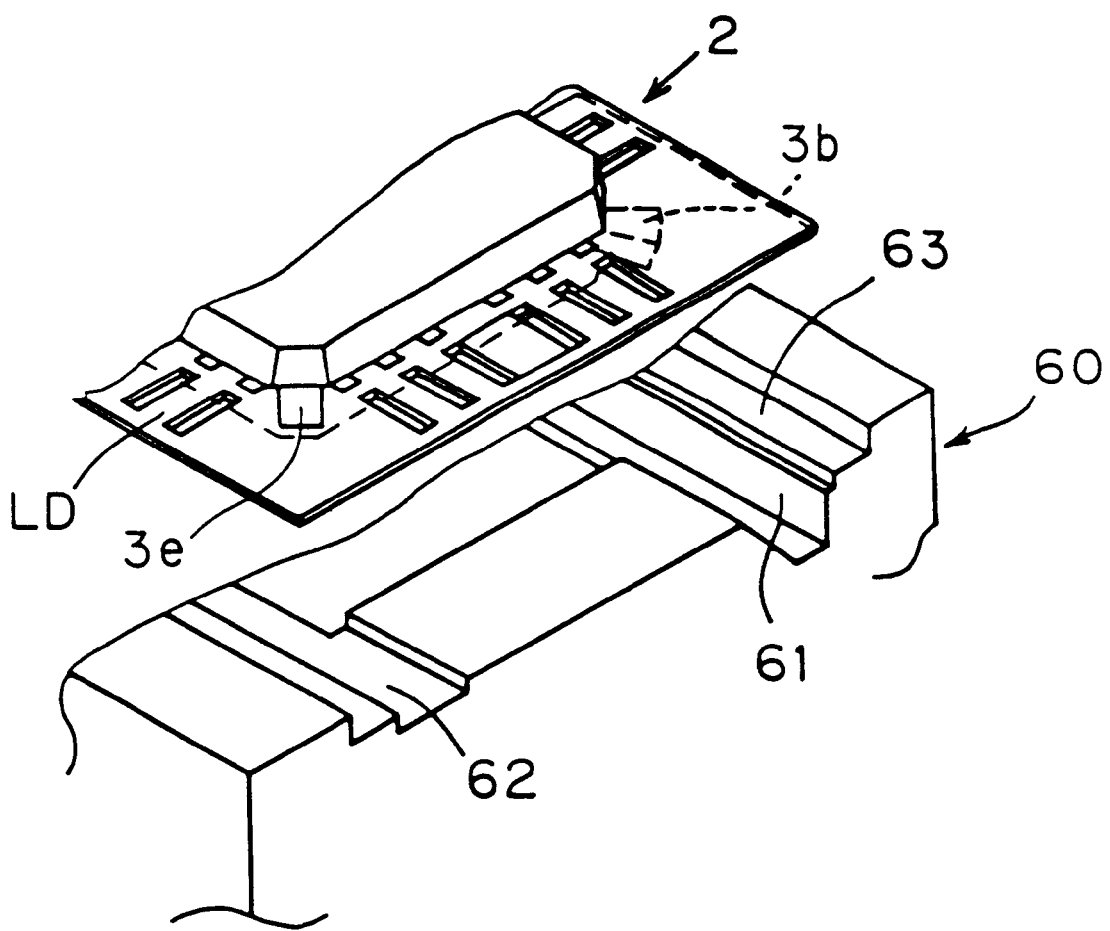
FIG. 29 is a perspective view for explaining a guide rail according to the third embodiment of the present invention.
Figure 30:
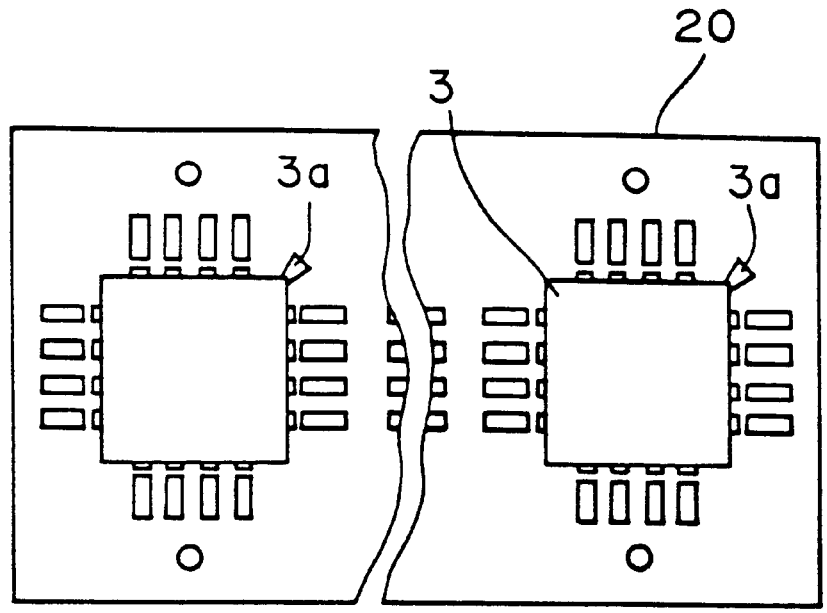
FIG. 30 is a diagram for explaining a general process of manufacturing a flat package semiconductor device.
Figure 31:
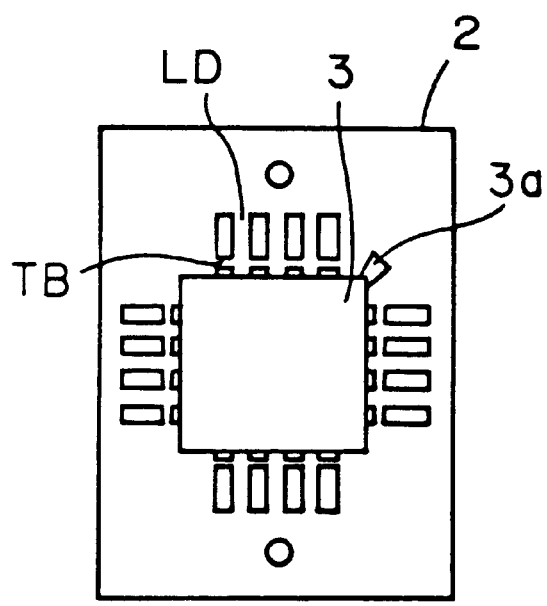
FIG. 31 is a diagram for explaining the general process of manufacturing a flat package semiconductor device.
Figure 32:
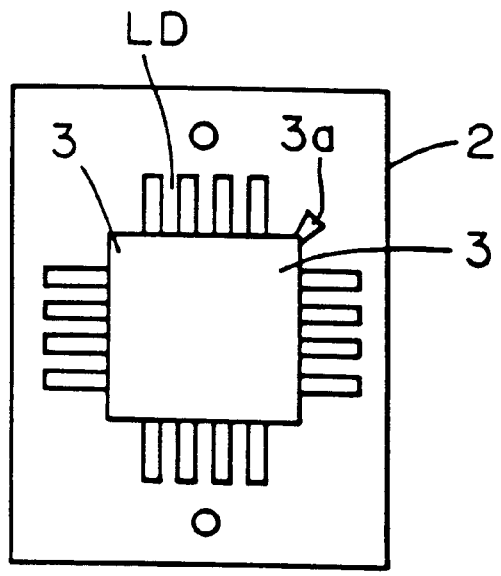
FIG. 32 is a diagram for explaining the general process of manufacturing a flat package semiconductor device.
Figure 33:
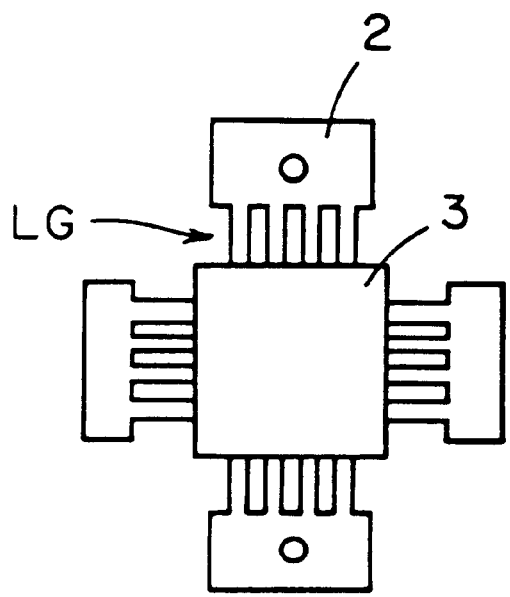
FIG. 33 is a diagram for explaining the general process of manufacturing a flat package semiconductor device.

FIG. 29 shows a structure of a guide rail 60 for carrying a lead frame. In FIG. 29, the guide rail 60 is provided with a gate clearance groove 61 corresponding to the remaining gate 3b and an air vent clearance groove 62 corresponding to the remaining air vent 3e in a longitudinal direction of the rail.

The gate clearance groove 61 and the air vent clearance groove 62 have such dimensions that the remaining gate 3b and the remaining air vent 3e do not come in contact with bottom and side faces of the respective grooves 61 and 62 when the lead frame 2 is mounted on a mounting groove 63.

Accordingly, also in the case where the lead frame 2 is slid and carried on the guide rail 60, the remaining gate 3b and the remaining air vent 3e are prevented from coming in contact with a surface of the guide rail 60. Consequently, a resin piece can be prevented from being generated from the remaining gate 3b and the remaining air vent 3e. Thus, there can be less possibility that the resin piece might cut into the sealing resin 3 during carrying or might stick to a surface of the lead LD.

While the invention has been described in detail, the foregoing description is in all aspects illustrative and not restrictive. It is understood that a numerous other modifications and variations can be devised without departing from the scope of the invention.

We claim:

1. A method for manufacturing a semiconductor device, comprising the steps of:
   (a) forming, on a lead frame, a sealing resin for sealing an integrated circuit by using a resin sealing die;
   (b) forming a crack in a predetermined position of a remaining gate extending from said sealing resin to said lead frame in a direction perpendicular to a direction of said extension corresponding to a gate of said resin sealing die; and
   (c) breaking off said remaining gate in a portion where said crack is formed when an unnecessary portion of said lead frame is removed by press molding.

2. The method for manufacturing a semiconductor device according to claim 1, wherein said step (b) includes a step of:
   (b-1) pushing, into said predetermined position of said remaining gate, a gate punch having an edge provided in a tip portion perpendicularly to said direction of extension of said remaining gate, and causing said edge to cut into said remaining gate.

3. The method for manufacturing a semiconductor device according to claim 2, wherein said remaining gate is a lower remaining gate formed on a lower face side of said lead frame,
   said gate punch is fixed to a frame receiving die for mounting said lead frame,
   said frame receiving die includes a remaining gate housing section provided so as to house said lower remaining gate when said lead frame is mounted, and
   said gate punch forms a part of a wall of said remaining gate housing section and is provided in such a manner that said edge is positioned lower than a face of said frame receiving die on which said lead frame is mounted,
   said step (b-1) including a step of:
   (b-2) mounting said lead frame on said frame receiving die and press molding down said lead frame from above to cause said edge to cut into said lower remaining gate, and sealing said lower remaining gate in a region defined by said gate punch, said remaining gate housing section and said lead frame.

4. The method for manufacturing a semiconductor device according to claim 3, wherein said frame receiving die is divided into a body section forming said remaining gate housing section and a cavity for housing said sealing resin, and said gate punch,
   said body section including:
   an elastic member for forcing said body section in one direction; and a slide guide which houses said elastic member, is inserted in said body section and is formed slidably with said body section, so that said body section is movable in a vertical direction, and said step (b-2) including a step of mounting said lead frame on said body section which is movable in said vertical direction.

5. The method for manufacturing a semiconductor device according to claim 3, wherein said remaining gate housing section has an inlet port connected to a collecting device, and said step (b) includes a step of sucking, through said inlet port, a resin piece generated when said edge cuts into said lower remaining gate.

6. The method for manufacturing a semiconductor device according to claim 2, wherein said remaining gate is an upper remaining gate formed on an upper face side of said lead frame, said gate punch is fixed to a frame presser for press molding an upper face of said lead frame, said frame presser includes a remaining gate housing section provided so as to house said upper remaining gate when said lead frame is pressed, and said gate punch forms a part of a wall of said remaining gate housing section and is provided in such a manner that said edge is positioned higher than a face of said frame presser press molding said lead frame, said step (b-1) including a step of:

(b-2) mounting said lead frame on a frame receiving die and press molding said lead frame by said frame presser to cause said edge to cut into said upper remaining gate, and sealing said upper remaining gate in a region defined by said gate punch, said remaining gate housing section and said lead frame.

7. The method for manufacturing a semiconductor device according to claim 6, wherein said frame presser is divided into a body section forming said remaining gate housing section and a cavity for housing said sealing resin, and said gate punch, said body section including:

an elastic member for forcing said body section in one direction; and a slide guide which houses said elastic member, is inserted in said body section and is formed slidably with said body section, so that said body section is movable in a vertical direction, and said step (b-2) including a step of press molding said lead frame by said body section which is movable in said vertical direction.

8. The method for manufacturing a semiconductor device according to claim 6, wherein said frame receiving die includes a collecting port connected to a collecting device in a position corresponding to said remaining gate housing section, said step (b) including a step of sucking, through said collecting port, a resin piece generated when said edge cuts into said upper remaining gate.

9. The method for manufacturing a semiconductor device according to claim 6, wherein said step (c) includes a step of:

(c-1) pushing an edge provided in a tip portion of a lead frame removing punch against a portion of said upper remaining gate into which said gate punch cuts and press molding down said lead frame removing punch, said lead frame removing punch including a remaining gate removing punch having said edge provided perpendicularly to a direction of extension of said upper remaining gate, and a remaining gate clearance section provided so as to house said upper remaining gate when said lead frame is pressed.

10. The method for manufacturing a semiconductor device according to claim 9, wherein said remaining gate removing punch is provided in such a manner that said edge is positioned higher than a face of said lead frame removing punch press molding said lead frame.

* * * * *